(12) United States Patent
Jang et al.

(10) Patent No.: US 12,490,552 B2
(45) Date of Patent: Dec. 2, 2025

(54) LIGHT EMITTING DEVICE AND LIGHT EMITTING MODULE HAVING THE SAME

(71) Applicant: SEOUL VIOSYS CO., LTD., Ansan-si (KR)

(72) Inventors: Jong Min Jang, Ansan-si (KR); Jin Hwa Shin, Ansan-si (KR); Seung Jo Yun, Ansan-si (KR); Sung Hyun Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 528 days.

(21) Appl. No.: 17/717,145

(22) Filed: Apr. 11, 2022

(65) Prior Publication Data

US 2022/0328719 A1 Oct. 13, 2022

Related U.S. Application Data

(60) Provisional application No. 63/324,557, filed on Mar. 28, 2022, provisional application No. 63/173,826, filed on Apr. 12, 2021.

(51) Int. Cl.
  *H10H 20/82* (2025.01)
  *H01L 23/00* (2006.01)
  (Continued)

(52) U.S. Cl.
  CPC ......... *H10H 20/82* (2025.01); *H01L 25/0756* (2013.01); *H10H 20/841* (2025.01);
  (Continued)

(58) Field of Classification Search
  CPC ......... H01L 33/10; H01L 33/18; H01L 33/20; H01L 33/22; H01L 33/24; H01L 33/44;
  (Continued)

(56) References Cited

U.S. PATENT DOCUMENTS 10,930,817 B2 2/2021 Yang et al.
2019/0006552 A1* 1/2019 Kanagawa ............ H01L 33/007
(Continued)

FOREIGN PATENT DOCUMENTS

CN 111596484 A * 8/2020 ......... G02F 1/13312
JP 2011-227188 11/2011
(Continued)

OTHER PUBLICATIONS

Zhong et al., Color film substrate and display panel, Aug. 28, 2020, machine translation of CN 111596484, pp. 1-9. (Year: 2020).*

(Continued)

*Primary Examiner* — Natalia A Gondarenko
(74) *Attorney, Agent, or Firm* — Oblon, McClelland, Maier & Neustadt, L.L.P.

(57) ABSTRACT

A light emitting device including a substrate having a protruding pattern on an upper surface thereof, a first sub-unit disposed on the substrate, a second sub-unit disposed between the substrate and the first sub-unit, a third sub-unit disposed between the substrate and the second sub-unit, a first insulation layer at least partially in contact with side surfaces of the first, second, and third sub-units, and a second insulation layer at least partially overlapping with the first insulation layer, in which at least one of the first insulation layer and the second insulation layer includes a distributed Bragg reflector.

21 Claims, 34 Drawing Sheets

(51) Int. Cl.
    *H01L 25/075*     (2006.01)
    *H10H 20/01*     (2025.01)
    *H10H 20/823*     (2025.01)
    *H10H 20/824*     (2025.01)
    *H10H 20/825*     (2025.01)
    *H10H 20/841*     (2025.01)
    *H10H 20/857*     (2025.01)

(52) U.S. Cl.
    CPC .............. *H01L 24/05* (2013.01); *H01L 24/06* (2013.01); *H01L 24/24* (2013.01); *H01L 24/29* (2013.01); *H01L 24/32* (2013.01); *H01L 24/33* (2013.01); *H01L 2224/05084* (2013.01); *H01L 2224/05111* (2013.01); *H01L 2224/0512* (2013.01); *H01L 2224/05139* (2013.01); *H01L 2224/05147* (2013.01); *H01L 2224/05155* (2013.01); *H01L 2224/05166* (2013.01); *H01L 2224/0518* (2013.01); *H01L 2224/05186* (2013.01); *H01L 2224/05582* (2013.01); *H01L 2224/05644* (2013.01); *H01L 2224/05686* (2013.01); *H01L 2224/06051* (2013.01); *H01L 2224/06517* (2013.01); *H01L 2224/24051* (2013.01); *H01L 2224/24147* (2013.01); *H01L 2224/2919* (2013.01); *H01L 2224/32145* (2013.01); *H01L 2224/33181* (2013.01); *H01L 2924/0542* (2013.01); *H01L 2924/0543* (2013.01); *H01L 2924/0544* (2013.01); *H01L 2924/05442* (2013.01); *H01L 2924/0549* (2013.01); *H10H 20/013* (2025.01); *H10H 20/0133* (2025.01); *H10H 20/0364* (2025.01); *H10H 20/823* (2025.01); *H10H 20/824* (2025.01); *H10H 20/825* (2025.01); *H10H 20/857* (2025.01)

(58) Field of Classification Search
    CPC ......... H01L 33/46; H01L 33/52; H01L 33/54; H01L 33/0062; H01L 33/0016; H01L 33/025; H01L 33/0066; H01L 33/0095; H01L 33/28; H01L 33/30; H01L 33/32; H01L 33/36; H01L 33/38; H01L 33/382; H01L 33/385; H01L 33/60; H01L 33/62; H01L 2224/05111; H01L 2224/0512; H01L 2224/05139; H01L 2224/05147; H01L 2224/05155; H01L 2224/05166; H01L 2224/0518; H01L 2224/05186; H01L 2224/05582; H01L 2924/0542; H01L 2924/0543; H01L 2924/0544; H01L 2924/05442; H01L 2924/0549; H01L 2224/05084; H01L 2933/0066; H01L 25/0753; H01L 25/0756; H01L 27/153; H01L 24/05; H01L 24/06; H01L 24/24; H01L 24/29; H01L 24/32; H01L 24/33; H01L 2224/05644; H01L 2224/05686; H01L 2224/06051; H01L 2224/06517; H01L 2224/24051; H01L 2224/24147; H01L 2224/2919; H01L 2224/32145; H01L 2224/33181; H10H 20/011; H10H 20/013; H10H 20/0133; H10H 20/0364; H10H 20/81; H10H 20/813; H10H 20/8131; H10H 20/819; H10H 20/82; H10H 20/823; H10H 20/824; H10H 20/825; H10H 20/857; H10H 20/84; H10H 20/841; H10H 29/14; H10H 29/24; H10H 29/345; H10H 29/352; H10H 29/8321
    USPC ............................................... 257/89, 88, 99
See application file for complete search history.

(56) References Cited

U.S. PATENT DOCUMENTS

| | | | |
|---|---|---|---|
| 2019/0165037 A1* | 5/2019 | Chae | .................. H01L 33/62 |
| 2019/0165207 A1* | 5/2019 | Kim | .................. H10H 20/8514 |
| 2019/0189596 A1 | 6/2019 | Chae et al. | |
| 2019/0198485 A1* | 6/2019 | Chae | .................. H01L 33/382 |
| 2019/0214373 A1 | 7/2019 | Kim et al. | |
| 2020/0006612 A1* | 1/2020 | Lee | .................. H01L 33/46 |
| 2020/0365647 A1 | 11/2020 | Jang et al. | |
| 2021/0082887 A1 | 3/2021 | Jang et al. | |

FOREIGN PATENT DOCUMENTS

| | | |
|---|---|---|
| KR | 10-2013-0022644 | 3/2013 |
| KR | 10-2017-0106044 | 9/2017 |
| KR | 10-2020-0090841 | 7/2020 |
| KR | 10-2021-0023423 | 3/2021 |

OTHER PUBLICATIONS

International Search Report dated Aug. 1, 2022, issued to PCT/KR2022/005268.
Extended European Search Report mailed Oct. 7, 2025, in European Application No. 22788393.1 filed Apr. 12, 2022 (citing document Nos. 1, 2 and 15 therein).

* cited by examiner

LIGHT EMITTING DEVICE AND LIGHT EMITTING MODULE HAVING THE SAME

CROSS REFERENCE TO RELATED APPLICATIONS

This application claims the benefit of U.S. Provisional Patent Application No. 63/173,826, filed on Apr. 12, 2021 and U.S. Provisional Patent Application No. 63/324,557, filed on Mar. 28, 2022, which are hereby incorporated by reference for all purposes as if fully set forth herein.

BACKGROUND

Field

Exemplary embodiments of the invention relate generally to a light emitting device and a light emitting module including the same and, more specifically to a light emitting device with an improved image qualify and a light emitting module including the same.

Discussion of the Background

A light emitting device may employ a semiconductor device, which may utilize a light emitting diode as an inorganic light source, and is used in various fields such as displays, vehicle lamps, and general lighting devices. A light emitting diode is rapidly replacing conventional light sources due to its longer lifespan, lower power consumption, and quicker response speed than conventional light sources.

Displays have been adopting a conventional light emitting device as a backlight unit. Recently, a display that directly displays images using a light emitting device has been developed. Such a display is generally referred to as a micro-LED display.

In general, a display realizes various colors by mixing blue, green, and red light. Such a display includes multiple pixels to display various images and each of the pixels includes blue, green, and red sub-pixels. The color of a specific pixel is determined upon the colors of these sub-pixels, and an image is realized by combination of these pixels.

In a case of a micro LED display, micro LEDs are arranged on a plane corresponding to each sub-pixel, and a large number of micro LEDs are mounted on one substrate. Since a micro-LED has a very small size of 200 µm or less, further 100 µm or less, it is generally difficult to transfer large number of micro LEDs to a circuit board due to its small form factor. In addition, even after the small-sized light emitting device is mounted on the circuit board, the light emitting device needs to be protected without optical distortion or loss of luminance.

Furthermore, when radiation patterns of blue light, green light, and red light emitted from one pixel are different from one another, a color of an image may be changed depending on an angle at which a user views a display screen, that is, a viewing angle.

The above information disclosed in this Background section is only for understanding of the background of the inventive concepts, and, therefore, it may contain information that does not constitute prior art.

SUMMARY

Light emitting devices constructed according to exemplary embodiments of the invention are capable of improving radiation pattern depending on angles, so as to alleviate a color tone change that may occur depending on an angle at which a user views a display screen, that is, a viewing angle, and a light emitting module having the same.

Exemplary embodiments also provide a light emitting device in which a difference in radiation patterns depending on angles of light of sub-pixels emitted from one pixel is alleviated, and a light emitting module having the same.

Additional features of the inventive concepts will be set forth in the description which follows, and in part will be apparent from the description, or may be learned by practice of the inventive concepts.

A light emitting device according to an exemplary embodiment of the present disclosure includes: a substrate having a protruding pattern on an upper surface thereof; a first sub-unit disposed on the substrate; a second sub-unit disposed between the substrate and the first sub-unit; a third sub-unit disposed between the substrate and the second sub-unit; a first insulation layer at least partially in contact with side surfaces of the first, second, and third sub-units; and a second insulation layer at least partially overlapping with the first insulation layer, in which at least one of the first insulation layer and the second insulation layer includes a distributed Bragg reflector.

The substrate may be a sapphire substrate, and the protruding pattern may include the same material as the substrate.

The protruding pattern may include protrusions, in which a diameter of each of the protrusions may be about 2 µm or less, and an interval between the protrusions may be about 1 µm or less.

The protrusions may have conical shapes.

The first sub-unit may include a first LED stack, the second sub-unit may include a second LED stack, the third sub-unit may include a third LED stack, and the first to third LED stacks may be configured to emit light of different wavelengths.

The first, second, and third LED stacks may be configured to emit red light, blue light, and green light, respectively.

The light emitting device may further include: a first connection electrode electrically connected to the first LED stack; a second connection electrode electrically connected to the second LED stack; a third connection electrode electrically connected to the third LED stack; and a fourth connection electrode electrically connected to each of the first, second, and third LED stacks.

At least one of the first, second, third, and fourth connection electrodes may overlap a side surface of each of the first, second, and third LED stacks.

The light emitting device may further include: a protection layer covering at least a portion of each of the first, second, third, and fourth connection electrodes while exposing a side surface of the substrate.

The light emitting device may further include: a first adhesive layer disposed between the first sub-unit and the second sub-unit; and a second adhesive layer disposed between the second sub-unit and the third sub-unit.

A thickness of the substrate to an overall thickness of the first sub-unit, the second sub-unit, and the third sub-unit may be in a range of 1.5:1 to 4:1.

The first insulation layer may include $SiO_2$ and the second insulation layer may include the distributed Bragg reflector including $SiO_2$ and $TiO_2$ alternately disposed with each other.

The distributed Bragg reflector may be configured to reflect about 95% or more of light emitted from the first, second, and third LED stacks.

The distributed Bragg reflector may have a reflectance of 90% or more in a wavelength range of 410 nm to 700 nm.

The thickness of the substrate may be less than that of a partial region of the protection layer surrounding the outermost side surfaces of the first to fourth connection electrodes.

The thickness of the substrate may be greater than that of a partial region of the protection layer disposed in a region vertically overlapping with the first sub-unit.

A light emitting module according to another exemplary embodiment includes: a circuit board; a light emitting device disposed on the circuit board; and a molding layer covering the light emitting device, in which the light emitting device includes: a substrate having a protruding pattern on an upper surface thereof; a first sub-unit disposed on the substrate; a second sub-unit disposed between the substrate and the first sub-unit; a third sub-unit disposed between the substrate and the second sub-unit; a first insulation layer at least partially in contact with side surfaces of the first, second, and third sub-unit; and a second insulation layer at least partially overlapping with the first insulation layer, in which at least one of the first insulation layer and the second insulation layer includes a distributed Bragg reflector.

The substrate may be a sapphire substrate and the protruding pattern may include the same material as the substrate.

The first sub-unit may include a first LED stack; the second sub-unit may include a second LED stack; and the third sub-unit may include a third LED stack, in which a thickness of the substrate to an overall thickness of the first sub-unit, the second sub-unit, and the third sub-unit may be in a range of 1.5:1 to 4:1.

The first insulation layer may be formed of $SiO_2$ and the second insulation layer may include the distributed Bragg reflector.

The distributed Bragg reflector may include $SiO_2$, and $TiO_2$ disposed alternately with each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
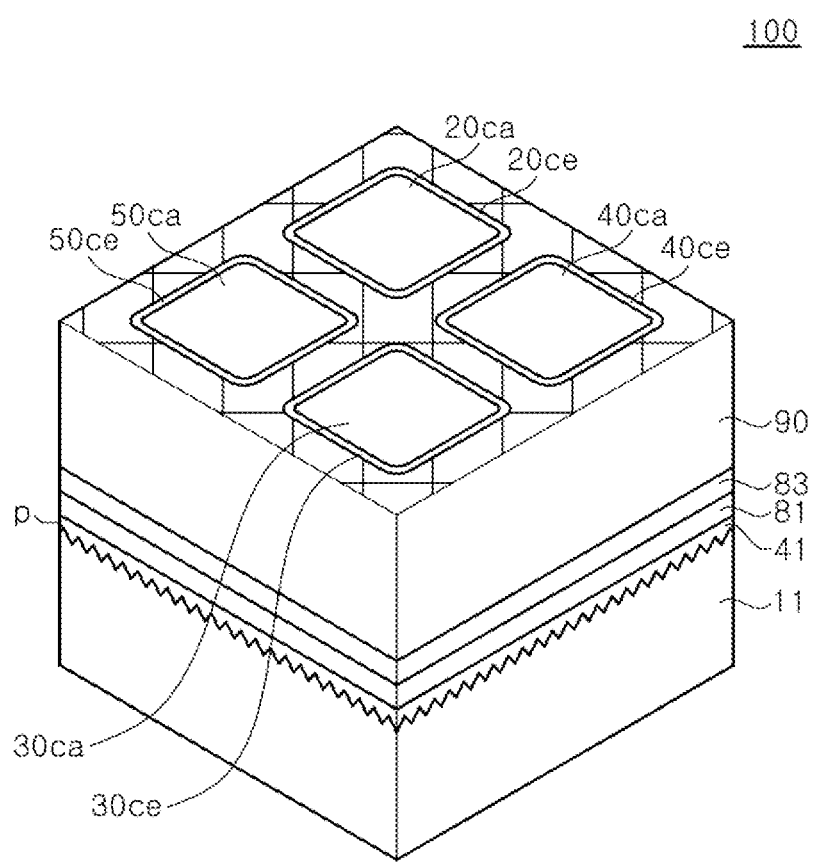
FIG. 1A is a schematic perspective view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1A, FIG. 1B, FIG. 1C and FIG. 1D are a perspective view, a plan view, and cross-sectional views of a light emitting device 100 according to an exemplary embodiment, respectively.

Referring to FIG. 1A to FIG. 1D, the light emitting device 100 may include a substrate 11, first, second, and third sub-units 2, 3, and 4, a first connection electrode 20ce, a second connection electrode 30ce, a third connection electrode 40ce, and a fourth connection electrode 50ce formed on the first, second, and third sub-units 2, 3, and 4, and a protection layer 90 covering the connection electrodes 20ce, 30ce, 40ce, and 50ce. The light emitting device 100 shown in FIG. 1A may be formed by separating an array of a plurality of light emitting devices formed on the substrate 11 into individual light emitting devices. A method of forming the array of light emitting devices 100 and separating the array into individual light emitting devices will be described in detail further below. The light emitting device 100 including the first, second, and third sub-units 2, 3, and 4 may be subjected to additional processes to form a light emitting module, which will also be described in detail further below.

The substrate 11 may include a light-transmitting insulating material. However, the inventive concepts are not limited thereto, and the substrate 11 in other exemplary embodiments may be translucent or partially transparent so as to transmit only light having a specific wavelength or transmit only a portion of light having a specific wavelength. The substrate 11 may be a growth substrate suitable for epitaxial growth of a third LED stack 40 described below, for example, a sapphire substrate. However, the inventive concepts are not limited thereto, and the substrate 11 in other exemplary embodiments may include various other transparent insulating materials. The substrate 11 may include glass, quartz, silicon, an organic polymer, or an organic-inorganic composite material. For example, the substrate 11 may include silicon carbide (SiC), gallium nitride (GaN), indium gallium nitride (InGaN), aluminum gallium nitride (AlGaN), aluminum nitride (AlN), gallium oxide ($Ga_2O_3$), and silicon substrates.

In addition, the substrate 11 may include a protruding pattern P on an upper surface thereof. More specifically, the protruding pattern P may include a plurality of protrusions protruding upward from the upper surface of the substrate 11. In an exemplary embodiment, each protrusion may have a substantially circular shape in plan view. When each protrusion of the protruding pattern P has a shape of an ellipsoid or a cone, a vertex portion of the ellipsoid or the cone may from its center. More specifically, the protrusions of the protruding pattern P may have a shape that decreases in width toward an upper part, and when each protrusion is cut into a plane vertical to the substrate 11, a cross-section of the protrusion may be approximately semi-elliptical, or may have a shape close to a triangular shape depending on the cutting plane. However, the inventive concepts are not limited thereto, and the protrusion in other exemplary embodiments may be formed to have various shapes, such as polygonal shapes, for example, a pentagon or a hexagon.

Each protrusion of the protruding pattern P may have, for example, a diameter of about 2 μm, and an interval between the protrusions may be about 1 μm. However, the inventive concepts are not limited thereto, and in some exemplary embodiments, a diameter of the protrusion may be less than or greater than 2 μm, and the interval between the protrusions may be narrower or wider than 1 μm depending on an application.

In an exemplary embodiment, the protruding pattern P may be formed of a same material as the substrate 11, for example, sapphire. However, the inventive concepts are not limited thereto, and the protruding pattern P in other exemplary embodiments may be formed of a material different from that of the substrate 11. The protruding pattern P may include a first material and a second material, and the first material and the second material may have different indices of refraction.

For example, when the first material and the second material have different indices of refraction, an index of refraction of the first material may be from about 1.6 to about 2.45, and an index of refraction of the second material may be from about 1.3 to about 2.0. Various insulating materials having different indices of refraction may be used as the first and second materials. As a material having the indices of refraction, for example, the first material may be sapphire, and the second material may be $SiO_x$, $SiO_xN_y$, $SiN_x$, or the like.

With the protruding pattern P formed on the upper surface of the substrate 11, the light emitting device may improve extraction efficiency of light emitted from the third sub-unit 4 adjoining the substrate 11. The protruding pattern P of the substrate 11 may selectively increase a luminous intensity of the third sub-unit 4 as compared to those of the first sub-unit 2 and the second sub-unit 3. Light generated from the first, second, and third sub-units 2, 3, and 4 is emitted through the substrate 11. When light generated from the first, second, and third sub-units 2, 3, and 4 passes through the substrate 11, light diffusion and light scattering may occur by the protruding pattern P, and thus, light extraction efficiency of the light emitting device 100 may be significantly increased.

In addition, a ratio of light extracted in a direction vertical to a rear surface of the substrate 11 is increased by the protruding pattern P, and a ratio of light extracted in a direction horizontal to the rear surface of the substrate 11 is relatively decreased. Accordingly, it is possible to reduce a deviation of light extracted from the light emitting device 100, for example, blue light, red light, and green light, and thus, a color tone change depending on viewing angles may be reduced.

An area of the substrate 11 may define an area of the light emitting device 100. In an exemplary embodiment, the substrate 11 may have the same area as the third sub-unit 4. The substrate 11 may have an area of about 60,000 μm² or less, specifically 30,000 μm² or less, more specifically 10,000 μm² or less. The substrate 11 may have a thickness of 30 μm to 180 μm, specifically, 30 μm to 100 μm. In an exemplary embodiment, the substrate 11 may have an area of 225 μm×225 μm and a thickness of 50 μm. As a ratio of the thickness to the area of the substrate 11 is smaller, the ratio of light extracted in the direction horizontal to the rear surface of the substrate 11, that is, to the side, with respect to a total light extracted from the light emitting device 100 to the outside may be reduced. In this manner, the ratio of light extracted through passing in the direction vertical to the rear surface of the substrate 11 may be increased. In particular, by reducing the thickness of the substrate 11, a greater amount of light emitted from the third sub-unit 4 adjacent to the substrate 11 may emitted in the direction vertical to the rear surface of the substrate 11. Accordingly, the deviation of light extracted from the light emitting device 100 may be reduced and alleviate the color tone change depending on the viewing angles.

Figure 1B:
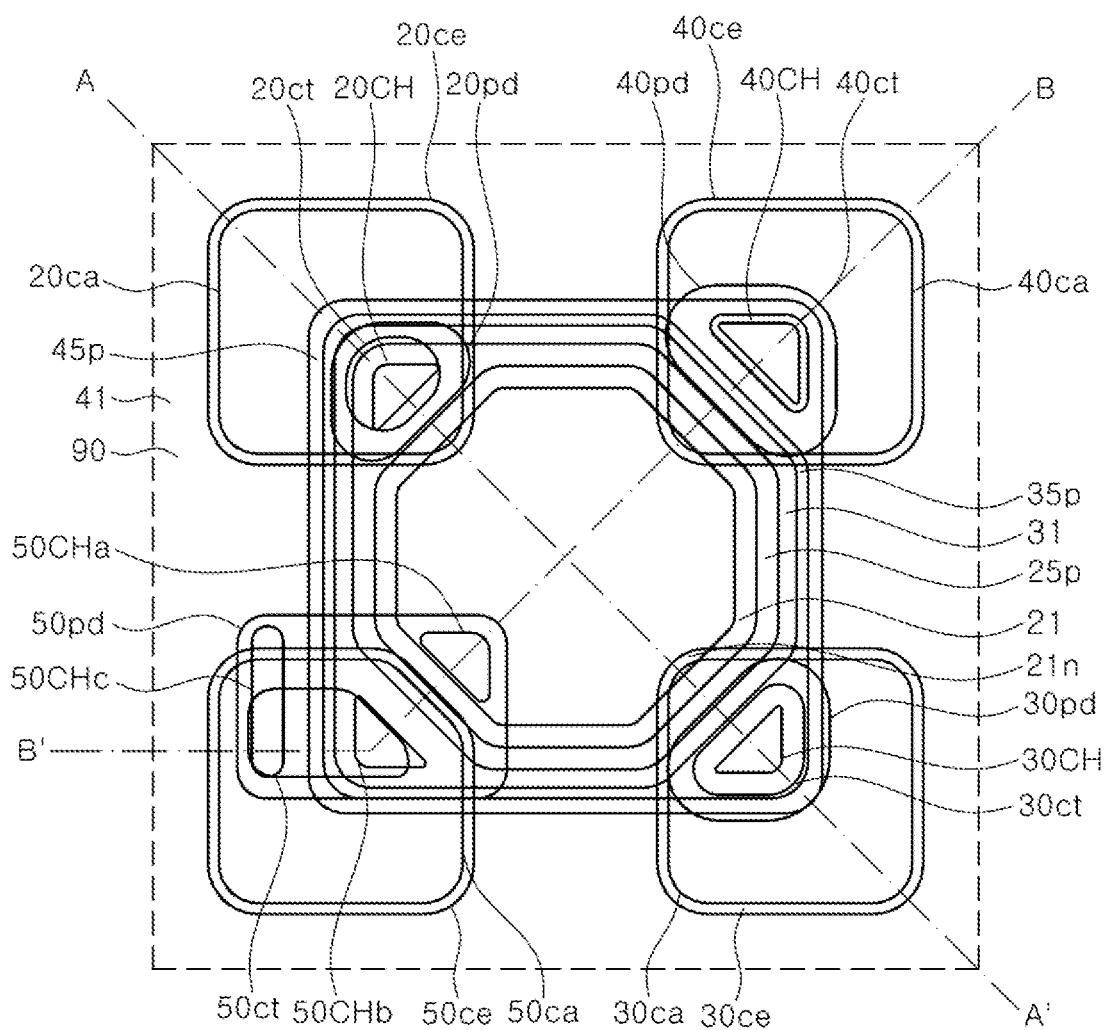
FIG. 1B is a schematic plan view of the light emitting device according to an exemplary embodiment.
Figure 1C:
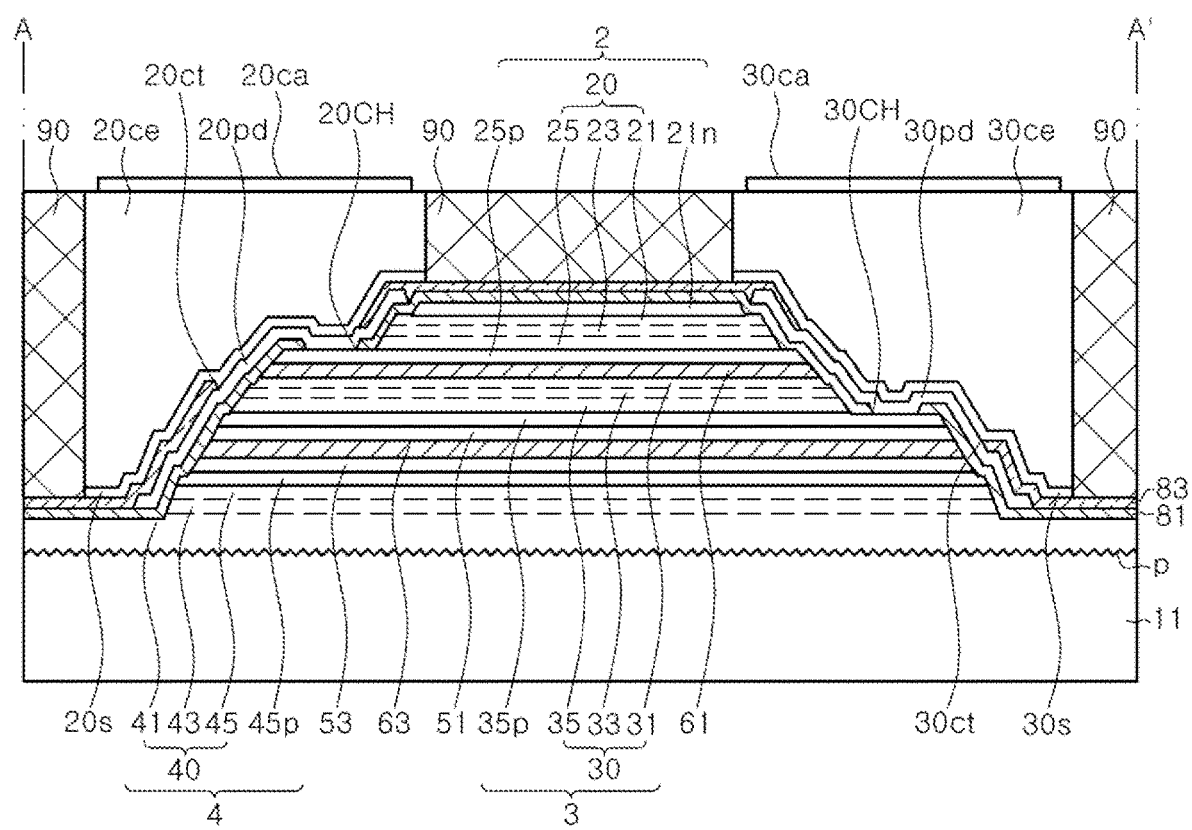
FIG. 1C is a schematic cross-sectional view taken along line A-A' of its corresponding plan view shown in FIG. 1B.
Figure 1D:
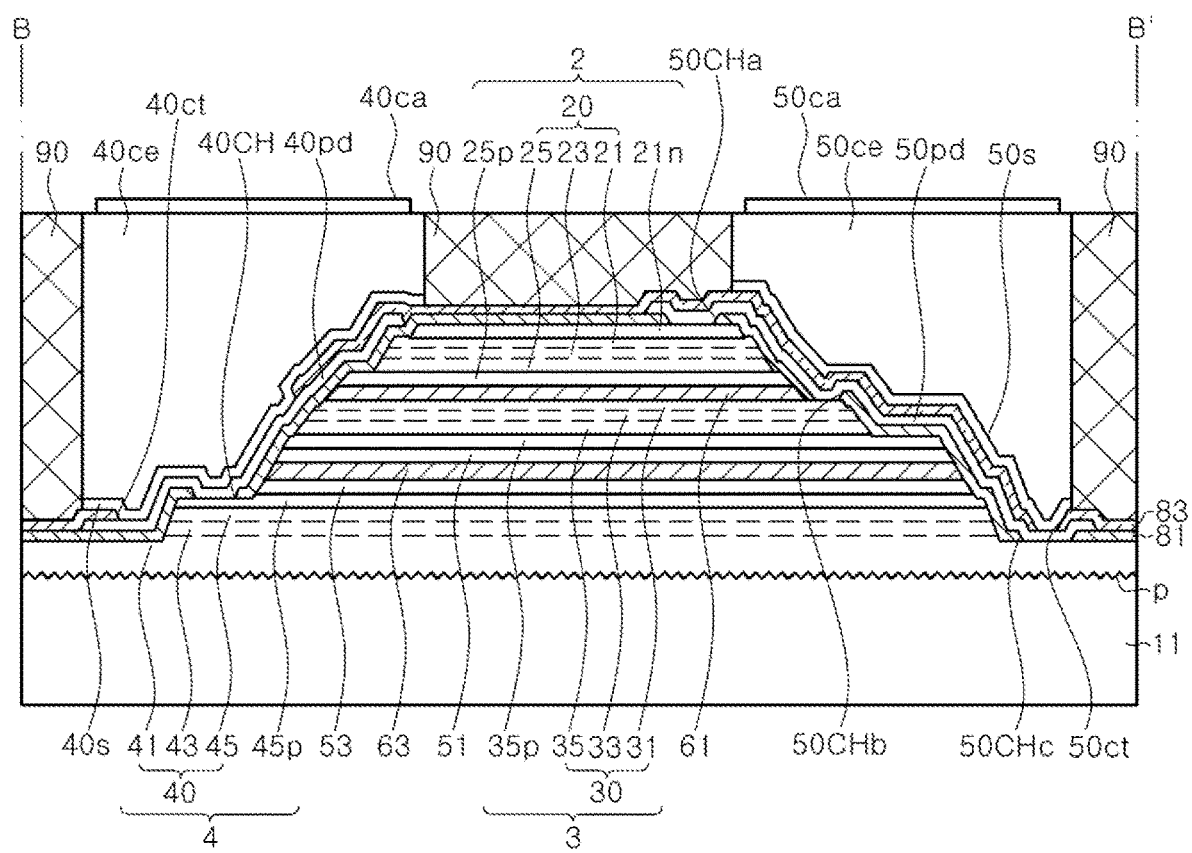
FIG. 1D is a schematic cross-sectional view taken along line B-B' of its corresponding plan view shown in FIG. 1B.

The light emitting device 100 may include the first sub-unit 2, the second sub-unit 3, and the third sub-unit 4 disposed on the substrate 11, as shown in FIG. 1C. According to an exemplary embodiment, the first, second, and third sub-units 2, 3, and 4 may emit light having different peak wavelengths. More specifically, light emitted from the first sub-unit 2 may pass through the second and third sub-units 3 and 4. In an exemplary embodiment, a sub-unit disposed farther away from the substrate 11 may emit light having a longer wavelength than that emitted from a sub-unit disposed closer to the substrate 11, thereby reducing optical loss. For example, the first sub-unit 2 may emit longer wavelength light than the second and third sub-units 3 and 4, and the second sub-unit 3 may emit longer wavelength light than the third sub-unit 4. For example, the first sub-unit 2 may emit red light, the second sub-unit 3 may emit green light, and the third sub-unit 4 may emit blue light.

In another exemplary embodiment, in order to adjust a mixing ratio between three colors of light emitted from the first, second, and third sub-units 2, 3, and 4, the second sub-unit 3 may emit shorter wavelength light than the third sub-unit 4. Accordingly, the intensity of light emitted from the second sub-unit 3 may be reduced while relatively increasing the intensity of light emitted from the third sub-unit 4, thereby controlling a luminous intensity ratio between the first, second, and third sub-units 2, 3, and 4. For example, the first sub-unit 2 may emit red light, the second sub-unit 3 may emit blue light, and the third sub-unit 4 may emit green light. In this manner, the intensity of blue light may be reduced while relatively increasing the intensity of green light, whereby an intensity ratio between red light, green light, and blue light may be adjusted to a value close to 3:6:1. In addition, the first, second, and third sub-units 2, 3, and 4 may have a light emitting area of 10,000 μm² or less, specifically 4,000 μm² or less, more specifically, 2,500 μm² or less. A sub-unit disposed closer to the substrate 11 may have a larger light emitting area. When the third sub-unit 4 emitting green light is disposed closest to the substrate 11, the intensity of green light may be further increased. Although the light emitting device 100 is exemplarily illustrated as including three sub-units 2, 3, and 4, the inventive concepts are not limited to a specific number of sub-units. For example, in some exemplary embodiments, the light emitting device 100 may include two or more than three sub-units. Hereinafter, the light emitting device 100 will exemplarily be described as including three sub-units 2, 3, and 4.

In addition, although the second sub-unit 3 is exemplarily described as emitting shorter wavelength light than the third sub-unit 4, for example, blue light, the inventive concepts are not limited thereto and the second sub-unit 3 may emit longer wavelength light than the third sub-unit 4, for example green light.

The first sub-unit 2 may include a first LED stack 20, a first upper contact electrode 21n, and a first lower contact electrode 25p.

The first LED stack 20 may include a first conductivity type semiconductor layer 21, an active layer 23, and a second conductivity type semiconductor layer 25. In an exemplary embodiment, the first LED stack 20 may include, for example, a red light emitting semiconductor, such as AlGaAs, GaAsP, AlGaInP, and GaP, without being limited thereto.

The first upper contact electrode 21n may be disposed on the first conductivity type semiconductor layer 21 to form an ohmic contact with the first conductivity type semiconductor layer 21. The first lower contact electrode 25p may be disposed under the second conductivity type semiconductor layer 25. According to an exemplary embodiment, the first conductivity type semiconductor layer 21 may be partially patterned and the first upper contact electrode 21n may be disposed in a patterned region of the first conductivity type semiconductor layer 21 to facilitate formation of an ohmic contact with the first conductivity type semiconductor layer 21. The first upper contact electrode 21n may have a monolayer structure or a multilayer structure, and may include Al, Ti, Cr, Ni, Au, Ag, Sn, W, Cu, or an alloy thereof, for example, Au—Te alloy or an Au—Ge alloy, without being limited thereto. In an exemplary embodiment, the first upper contact electrode 21n may have a thickness of, for example, about 100 nm, and may include a high-reflectance metal to reflect light downwardly toward the substrate 11.

The first lower contact electrode 25p may form an ohmic contact with the second conductivity type semiconductor layer 25 of the first LED stack 20, and may be disposed under the second conductivity type semiconductor layer 35.

The second sub-unit 3 may include a second LED stack 30 and a second lower contact electrode 35p.

The second LED stack 30 may include a first conductivity type semiconductor layer 31, an active layer 33, and a second conductivity type semiconductor layer 35. In an exemplary embodiment, the second LED stack 30 may include a blue light emitting semiconductor, such as GaN, InGaN, and ZnSe, without being limited thereto. The second lower contact electrode 35p may be disposed under the second conductivity type semiconductor layer 35 of the second LED stack 30, and may form an ohmic contact with the second conductivity type semiconductor layer 35.

The third sub-unit 4 may include a third LED stack 40 and a third lower contact electrode 45p.

The third LED stack 40 may include a first conductivity type semiconductor layer 41, an active layer 43, and a second conductivity type semiconductor layer 45. In an exemplary embodiment, the third LED stack 40 may include a green light emitting semiconductor, such as GaN, InGaN, GaP, AlGaInP, and AlGaP. The third lower contact electrode 45p may be disposed under the second conductivity type semiconductor layer 45 of the third LED stack 40, and may form an ohmic contact with the second conductivity type semiconductor layer 45.

In some exemplary embodiments, each of the first conductivity type semiconductor layers 21, 31, and 41 and the second conductivity type semiconductor layers 25, 35, and 45 of the first, second, and third LED stacks 20, 30, and 40 may have a monolayer structure or a multilayer structure, and may include a super-lattice layer. In addition, each of the active layers 23, 33, and 43 of the first, second, and third LED stacks 20, 30, and 40 may have a single quantum well structure or a multi-quantum well structure.

An overall thickness from the first sub-unit 2 to the third sub-unit 4 including the first, second, and third LED stacks 20, 30, and 40 may be, for example, about 10 µm to about 30 µm. In some exemplary embodiments, the overall thickness of the first sub-unit 2 to the third sub-unit 4 may range from about 15 µm to about 25 µm, more particularly, about 18 µm to about 22 µm, without being limited thereto. The substrate 11 may be thicker than the overall thickness of the first, second, and third sub-units 2, 3, and 4. In an exemplary embodiment, the thickness of the substrate 11 to the thicknesses of the first, second, and third sub-units 2, 3, and 4 may be in a range of 1.5:1 to 6:1, further, 1.5:1 to 4:1, furthermore, 2.27:1 to 2.78:1. As the thickness ratio decreases, that is, as the thickness of the substrate 11 with respect to the thicknesses of the first, second, and third sub-units 2, 3, and 4 decreases, the ratio of light extracted to the side of the substrate 11 with respect to light emitted to the outside of the light emitting device 100 is reduced, and thus, the ratio of light extracted through the substrate 11 in the direction vertical to the rear surface of the substrate 11 is increased. Accordingly, the color tone change depending on the viewing angles may be alleviated by reducing a difference between radiation patterns of light extracted from the light emitting device 100.

The thickness of the substrate 11 may be greater than the thickness including the first, second, and third LED stacks 20, 30, and 40, or may be greater than a thickness of a partial region of the protection layer 90 disposed between the connection electrodes 20ce, 30ce, 40ce, and 50ce and formed in a region vertically overlapping with the first, second, and third LED stacks 20, 30, and 40. In addition, the thickness of the substrate 11 may be smaller than a partial region of the protection layer 90 surrounding outermost sides of the connection electrodes 20ce, 30ce, 40ce, and 50ce. As such, it is possible to effectively reduce a light difference depending on the viewing angles.

Each of the first, second, and third lower contact electrodes 25p, 35p, and 45p may include a transparent conductive material. For example, each of the lower contact electrodes 25p, 35p, and 45p may include a transparent conductive oxide (TCO). Examples of the transparent conductive oxide (TCO) may include SnO, InO$_2$, ZnO, ITO, and ITZO, without being limited thereto.

A first adhesive layer 61 may be interposed between the first LED stack 20 and the second LED stack 30, and a second adhesive layer 63 may be interposed between the second LED stack 30 and the third LED stack 40. Each of the first and second adhesive layers 61 and 63 may include a non-conductive light transmitting material. For example, each of the first and second adhesive layers 61 and 63 may include an optically clear adhesive (OCA), which may include epoxy, polyimide, SUB, spin-on-glass (SOG), and benzocyclobutene (BCB), without being limited thereto.

A first stress relief layer 51 may be disposed on an upper surface of the second adhesive layer 63 between the second adhesive layer 63 and the second LED stack 30. A second stress relief layer 53 may be disposed on a lower surface of the second adhesive layer 63 between the second adhesive layer 63 and the third LED stack 40. Each of the first and second stress relief layers 51 and 53 may include an insulating material. For example, each of the first and second stress relief layers 51 and 53 may include organic or inorganic insulating materials, such as $SiO_2$, $SiN_x$, $Al_2O_3$, and the like, for example, $SiO_2$, without being limited thereto.

The first and second stress relief layers 51 and 53 may be interposed between the LED stacks 20, 30, and 40, which are disposed to be vertically overlapped. More specifically, in a course of sequentially bonding the second LED stack 30 and the first LED stack 20 on the third LED stack 40, warpage of the substrate 11 may occur, which may generate cracks between the LED stacks 20, 30, and 40. The first and second stress relief layers 51 and 53 disposed between the LED stacks 20, 30, and 40 may relieve warpage of the substrate 11, and thus, defects such as cracks that may otherwise occur between the LED stacks 20, 30, and 40 may be suppressed or prevented.

A first insulation layer 81 and a second insulation layer 83 may be disposed on at least a portion of the upper and side surfaces of the first, second, and third LED stacks 20, 30, and 40. At least one of the first and second insulation layers 81 and 83 may include various organic or inorganic insulating materials, for example, polyimide, $SiO_2$, $SiN_x$, $Al_2O_3$, and the like. In addition, at least one of the first and second insulation layers 81 and 83 may include a monolayer structure or a multilayer structure. The multilayer structure may include, for example, a distributed Bragg reflector (DBR). In an exemplary embodiment, the first insulation layer 81 may be formed of $SiO_2$ and the second insulation layer 83 may be formed of a distributed Bragg reflector (DBR), without being limited thereto, or the first insulation layer 81 may be formed of a distributed Bragg reflector (DBR), and the second insulation layer 83 may be formed of $SiO_2$. A thickness of the first insulation layer 81 may be within 0.4 μm, a thickness of the second insulation layer 83 may be 1.8 μm to 1.9 μm, or the thickness of the first insulation layer 81 may be 1.8 μm to 1.9 μm, and the thickness of the second insulation layer 83 may be 0.4 μm. However, the inventive concepts are not limited thereto, and the thicknesses of the first and second insulation layers 81 and 83 in some exemplary embodiments may be varied depending on a target wavelength range of light emitted from the light emitting device 100.

The distributed Bragg reflector (DBR) of the first insulation layer 81 or the second insulation layer 83 may include a first material layer having a first index of refraction and a second material layer having a second index of refraction. The first material layer may have a low index of refraction and the second material layer may have a high index of refraction. As used herein, "low index of refraction" and "high index of refraction" are relative terms used to compare the indices of refraction of the first material layer and the second material layer. In an exemplary embodiment, the first material layer may be $SiO_2$ and the second material layer may s be $TiO_2$. In addition, $SiO_2$ forming the first material layer has an index of refraction of about 1.47 and $TiO_2$ forming the second material layer has an index of refraction of about 2.41. However, the inventive concepts are not limited thereto, and the first material layer and the second material layer in other exemplary embodiments may be formed of $Si_3N_4$, $MgF_2$, $Nb_2O_5$, ZnS, $ZrO_2$, ZnO, or a compound semiconductor. In some exemplary embodiments, a difference in index of refraction between the first material layer and the second material layer be greater than 0.5.

The distributed Bragg reflector (DBR) may be formed by repeatedly stacking the first material layer and the second material layer multiple times. In general, a material layer having a high index of refraction has a higher absorption rate than a material layer having a low is index of refraction. Accordingly, optical loss due to light absorption may be reduced by controlling the optical thickness of the second material layer having a high index of refraction than that of the first material layer having a low index of refraction. Thus, $SiO_2$ as the first material layer may have a greater thickness than $TiO_2$ as the second material layer.

In addition, first and last layers of the distributed Bragg reflector (DBR) may be $SiO_2$. By using the $SiO_2$ as the first layer of the distributed Bragg reflector (DBR), it is possible to enhance adhesion of the distributed Bragg reflector (DBR) to the first insulation layer 81, and by using $SiO_2$ as the last layer, it is possible to protect the distributed Bragg reflector (DBR) and to enhance adhesion between the protection layer 90 and connection electrodes 20ce, 30ce, 40ce, and 50ce, which will be described later.

According to an exemplary embodiment, the distributed Bragg reflector (DBR) as the second insulation layer 83 may have a reflectance of 95% or more over a wavelength range of 400 to 650 nm, and thus, light emitted from the light emitting device 100 and incident s onto the distributed Bragg reflector (DBR) may be reflected with a high reflectance. The distributed Bragg reflector (DBR) may be formed of, for example, 21 layers, without being limited thereto. For example, the distributed Bragg reflector (DBR) may include 41 layers of the first material layer and the second material layer, and may have a thickness of 3 μm to 5 μm. The distributed Bragg reflector (DBR) may have a reflectance of 90% or more in a wavelength range of 410 nm to 700 nm.

The second insulation layer 83 may improve light extraction efficiency by reflecting light emitted from the first, second, and third LED stacks 20, 30, and 40. In addition, the multilayer distributed Bragg reflector (DBR) may improve straightness of extracted light through formation of an optical cavity, and a color tone change depending on a viewing angle may be alleviated by reducing variations in radiation patterns of blue light, green light, and red light.

The first insulation layer 81 may be etched so as to form contact holes 20CH, 30CH, 40CH, and 50CH, which will be described later. When the first insulation layer 81 is formed as a single layer of $SiO_2$, the first insulation layer 81 may be easily etched. Accordingly, it is possible to secure a uniform etching thickness without damaging the underlying lower contact electrodes 25p, 35p, and 45p, thereby securing the electrical properties. In addition, the distributed Bragg reflector (DBR) of the second insulation layer 83 may improve light extraction efficiency by inducing diffuse reflection of light extracted from the side surfaces of the first, second, and third sub-units 2, 3, and 4.

When the first insulation layer 81 is formed of a dielectric layer having a low index of refraction, such as $SiO_2$, the first insulation layer 81 may function as an omni-directional reflector in conjunction with the first to third LED stacks 20, 30, and 40 and electrode pads 20pd, 30pc, 40pd, and 50pd covering the first insulation layer 81.

In another exemplary embodiment, the first insulation layer 81 may be formed of a distributed Bragg reflector (DBR) and the second insulation layer 83 may be formed of a monolayer, for example, $SiO_2$. The distributed Bragg reflector (DBR) forming the first insulation layer 81 may be, for example, a $SiO_2/TiO_2$ stack, and may have a thickness of 1.8 μm to 1.9 μm. In addition, $SiO_2$ forming the second insulation layer 83 may have a thickness of 0.4 μm.

In another exemplary embodiment, both of the first and second insulation layers 81 and 83 may be formed of a distributed Bragg reflector (DBR). In an exemplary embodiment, the first and second insulation layers 81 and 83 may have an overall high reflectance in a wide wavelength band of visible light. In another exemplary embodiment, the first insulation layer 81 and the second insulation layer 83 may have high reflectance in different wavelength bands from each other. For example, the first insulation layer 81 may have a high reflectance in a wavelength band of light emitted from any one or two LED stacks of the first, second, and third LED stacks 20, 30, and 40, and the second insulation layer 83 may have a high reflectance in a wavelength band of light emitted from the remaining LED stacks. As the first and second insulation layers 81 and 83 are formed to have selectively high reflectance in a specific wavelength band, it is possible to secure the reflectance of light while simplifying a stacked structure of each of the first and second insulation layers 81 and 83. However, the inventive concepts are not limited thereto, and materials, thicknesses, and structures of the first and second insulation layers 81 and 83 in other exemplary embodiments may vary depending on wavelength bands of light emitted from the light emitting device 100.

Each of the first, second, and third LED stacks 20, 30, and 40 may be operated independently. In an exemplary embodiment, a common voltage may be applied to the first conductivity type semiconductor layers 21, 31, and 41 of the first, second, and third LED stacks 20, 30, and 40, and an individual light emitting signal may be applied to each of the second conductivity type semiconductor layers 25, 35, and 45. In another exemplary embodiment, the individual light emitting signal may be applied to each of the first conductivity type semiconductor layers 21, 31, and 41 of the first, second, and third LED stacks 20, 30 and 40, and the common voltage may be applied to the second conductivity type semiconductor layers 25, 35, and 45. For example, the first conductivity type semiconductor layers 21, 31, and 41 of each of the LED stacks 20, 30, and 40 may be n-type, and the second conductivity type semiconductor layers 25, 35, and 45 may be p-type. In this case, the common voltage may be applied to the first conductivity type semiconductor layers 21, 31, and 41, and the individual light emitting signals may be applied to each of the second conductivity type semiconductor layers 25, 35 and 45, or vice versa. When the first, second, and third LED stacks 20, 30, and 40 are vertically stacked, the third LED stack 40 may have a revered stacked sequence as compared to those of the first and second LED stacks 20 and 30. That is, the second conductivity type semiconductor layer 45 of the third LED stack 40, for example, the p-type semiconductor layer 45 may be disposed over the active layer 43, and the second conductivity type semiconductor layer 35 of the second LED stack 30 may be disposed under the active layer 33. By stacking the layers forming the third LED stack 40 in a reverse order as compared to that of the second LED stack 30, a process of manufacturing the light emitting device 100 may be simplified. In the illustrated exemplary embodiment, the first conductivity type semiconductor layer and the second conductivity type semiconductor layer are described as n-type and p-type, respectively, without being limited thereto, or vice versa.

According to the illustrated exemplary embodiment, the light emitting device 100 may include a first electrode pad 20pd, a second electrode pad 30pd, a third electrode pad 40pd, and a fourth electrode pad 50pd. The second conductivity type semiconductor layers 25, 35, and 45 of the LED stacks 20, 30, and 40 may be connected to the first electrode pad 20pd, the second electrode pad 30pd, and the third electrode pad 40pd, respectively, to receive a corresponding light emission signal. The first conductivity type semiconductor layers 21, 31, and 41 of the LED stacks 20, 30, and 40 may be connected to the fourth electrode pad 50pd to receive a common voltage from the outside. In this manner, each of the first, second, and third LED stacks 20, 30, and 40 may be individually operated while having a common n-type electrode to which the common voltage is applied, without being limited thereto.

The first electrode pad 20pd may be connected to the first lower contact electrode 25p through a first contact hole 20CH defined through the first insulation layer 81 to be electrically connected to the second conductivity type semiconductor layer 25. The first electrode pad 20pd may be disposed between the first insulation layer 81 and the second insulation layer 83 to have a region that is partially overlapped with the first insulation layer 81 and the second insulation layer 83.

The second electrode pad 30pd may be connected to the third lower contact electrode 45p through a second contact hole 30CH defined through the first insulation layer 81 to be electrically connected to the second conductivity type semiconductor layer 45. The second electrode pad 30pd may be disposed between the first insulation layer 81 and the second insulation layer 83 to have a region that is partially overlapped with the first insulation layer 81 and the second insulation layer 83.

The third electrode pad 40pd may be connected to the second lower contact electrode 35p through a third contact hole 40CH defined through the first insulation layer 81 to be electrically connected to the second conductivity type semiconductor layer 35. The third electrode pad 40pd may be disposed between the first insulation layer 81 and the second insulation layer 83 to have a region that is partially overlapped with the first insulation layer 81 and the second insulation layer 83.

The fourth electrode pad 50pd may be electrically connected to the first conductivity type semiconductor layers 21, 31, and 41 of the first, second, and third LED stacks 20, 30, and 40 through a first sub-contact hole 50CHa, a second sub-contact hole 50CHb, and a third sub-contact hole 50CHc defined through the first insulation layer 81 on the first conductivity type semiconductor layers 21, 31, and 41 of the first, second, and third LED stacks 20, 30, and 40. More specifically, the fourth electrode pad 50pd may be electrically connected to the first conductivity type semiconductor layer 21 of the first LED stack 20, the first conductivity type semiconductor layer 31 of the second LED stack 30, and the first conductivity type semiconductor layer 41 of the LED stack 40 through the first sub-contact hole 50CHa, the second sub-contact hole 50CHb, and the third sub-contact hole 50CHc, respectively.

In an exemplary embodiment, the electrode pads 20pd, 30pd, 40pd, and 50pd may be formed at various locations. For example, when the light emitting device 100 has a rec shape as shown in FIG. 1B, the electrode pads 20pd, 30pd, 40pd, and 50pd may be disposed in a vicinity of corners of the square, respectively. However, the inventive concepts are not limited thereto, and in other exemplary embodiments, the light emitting device 100 may have various other shapes and the location of the electrode pads 20pd, 30pd, 40pd, and 50pd may be varied depending on the shape of the light emitting device.

The first, second, third, and fourth electrode pads 20pd, 30pd, 40pd, and 50pd may be spaced apart from one another and may be electrically isolated from one another. In an exemplary embodiment, each of the first, second, third, and fourth electrode pads 20pd, 30pd, 40pd, and 50pd may cover at least a portion of the side surface of each of the first, second, and third LED stacks 20, 30, and 40.

Each of the first to fourth connection electrodes 20ce, 30ce, 40ce, and 50ce may be formed to have an elongated shape in a vertical direction from the substrate 11. The first connection electrode 20ce may be electrically connected to the first electrode pad 20pd through a first through-hole 20ct defined through the second insulation layer 83. The second connection electrode 30ce may be electrically connected to the second electrode pad 30pd through a second through-hole 30ct defined through the second insulation layer 83. The third connection electrode 40ce may be electrically connected to the third electrode pad 40pd through a third through-hole 40ct defined through the second insulation layer 83. The fourth connection electrode 50ce may be electrically connected to the fourth electrode pad 50pd through a fourth through-hole 50ct defined through the second insulation layer 83.

Each of the first to fourth connection electrodes 20ce, 30ce, 40ce, and 50ce may include metal, such as Cu, Ni, Ti, Sb, Mo, Co, Sn, and Ag, or an alloy thereof, without being limited thereto. For example, each of the first to fourth connection electrodes 20ce, 30ce, 40ce, and 50ce may include two or more different metals or metal layers so as to reduce stress due to the elongated shape thereof. When the first to fourth connection electrodes 20ce, 30ce, 40ce, and 50ce include Cu, the first to fourth connection electrodes 20ce, 30ce, 40ce, and 50ce may include an additional metal so as to suppress oxidation of Cu. The first to fourth connection electrodes 20ce, 30ce, 40ce, and 50ce may include Cu/Ni/Sn, and in this case, Cu may prevent Sn from infiltrating into the light emitting device 100, and heat generated from the light emitting device 100 may be easily discharged to the outside due to favorable thermal conductivity of Cu.

The first to fourth connection electrodes 20ce, 30ce, 40ce, and 50ce may further include seed layers 20s, 30s, 40s, and 50s, respectively, and each of the seed layers forms metal layer during a subsequent plating process. Each of the seed layers 20s, 30s, 40s, and 50s may be formed of, for example, multiple Ti/Cu layers.

Each of the first to fourth connection electrodes 20ce, 30ce, 40ce, and 50ce may have a flat upper surface, and accordingly, may facilitate electrical connection between the first, second, and third LED stacks and an external line or a circuit electrode described below. In an exemplary embodiment, when the light emitting device 100 includes a micro-LED having a surface area of less than 10,000 $\mu m^2$, specifically less than 4,000 $\mu m^2$ or less than 2,500 $\mu m^2$, each of the first to fourth connection electrodes 20ce, 30ce, 40ce, and 50ce may overlap a portion of at least one of the first, second, and third LED stacks 20, 30, and 40. More specifically, each of the first to fourth connection electrodes 20ce, 30ce, 40ce, and 50ce may overlap at least one stepped portion formed on the side surfaces of the first, second, and third LED stacks 20, 30, and 40. As such, each of the first to fourth connection electrodes 20ce, 30ce, 40ce, and 50ce may have a lower surface having a larger surface area than the upper surface to secure a sufficient contact area between the first to fourth connection electrodes 20ce, 30ce, 40ce, and 50ce and the first, second, and third LED stacks 20, 30, and 40. Accordingly, the first to fourth connection electrodes 20ce, 30ce, 40ce, and 50ce may be stably formed on the first, second, and third sub-units 2, 3, and 4. In addition, the connection electrodes 20ce, 30ce, 40ce, and 50ce connected to the electrode pads 20pd, 30pd, 40pd, and 50pd occupy most of the area of the light emitting device 100, and thus, it is possible to provide a light emitting device advantageously dissipating heat generated by the light emitting device. Further, the connection electrodes 20ce, 30ce, 40ce, and 50ce may efficiently dissipate heat generated by the light emitting device 100 along the shortest path.

According to an exemplary embodiment, the protection layer 90 may be formed on the first, second, and third sub-units 2, 3, and 4. More specifically, the protection layer 90 may be formed between the first to fourth connection electrodes 20ce, 30ce, 40ce, and 50ce to cover side surfaces of at least some of the first, second, and third sub-units 2, 3, and 4 and side surfaces of the first to fourth connection electrodes 20ce, 30ce, 40ce, and 50ce, as shown in FIG. 1A. The protection layer 90, as shown in the drawing, may expose the side surfaces of the substrate 11, the first and second insulation layers 81 and 83, and the third LED stack 40. The protection layer 90 may be flush with the upper surfaces of the first to fourth connection electrodes 20ce, 30ce, 40ce, and 50ce, and may include an epoxy molding compound (EMC) or the like. The protection layer 90 may be transparent or may be formed in various colors, such as black, white, and others. The protection layer 90 may include polyimide (PID), and polyimide (PID) may be applied to the first, second, and third sub-units 2, 3, and 4 in a form of a dry film rather than a liquid so as to increase the flatness of the protection layer 90. In addition, the protection layer 90 may include a photosensitive material. Thus, the protection layer 90 not only protects the first, second, and third sub-units 2, 3, and 4 from possible external shock during subsequent processes, but also secures a sufficient contact area of the light emitting device 100 to facilitate handling during a subsequent transferring process. In addition, the protection layer 90 may prevent light leakage through the side surface of the light emitting device 100 to prevent or suppress interference of light emitted from adjacent light emitting devices 100.

Protection metal layers 20ca, 30ca, 40ca, and 50ca may be further be formed on the connection electrodes 20ce, 30ce, 40ce, and 50ce, respectively. Each of the protection metal layers 20ca, 30ca, 40ca, and 50ca may be a multilayer metal film, for example, a Ti/Ni/Au film, without being limited thereto. The protection metal layers 20ca, 30ca, 40ca, and 50ca may be formed on the upper surfaces of the first to fourth connection electrodes 20ce, 30ce, 40ce, and 50ce, respectively, and may have smaller widths than the first to fourth connection electrodes 20ce, 30ce, 40ce, and 50ce. Accordingly, the protection metal layers 20ca, 30ca, 40ca, and 50ca may have smaller surface areas than the first to fourth connection electrodes 20ce, 30ce, 40ce, and 50ce. However, the inventive concepts are not limited thereto, and in some exemplary embodiments, the protection metal layers 20ca, 30ca, 40ca, and 50ca may have greater widths than the first to fourth connection electrodes 20ce, 30ce, 40ce, and 50ce, and thus, may have g surface areas than the first to fourth connection electrodes 20ce, 30ce, 40ce, and 50c.

A plurality of light emitting devices 100 may be formed on the substrate 11 in an array. The substrate 11 may be cut along scribing lines to obtain individual light emitting devices 100, which, in turn, may be transferred to another substrate or a tape using various transferring techniques for subsequent processes, such as packaging or modularization.

Hereinafter, a method of manufacturing the light emitting device 100 according to an exemplary embodiment will be described. Description of the same features and/or same elements already described above will be omitted or briefly given.

FIG. 2A, FIG. 3A, FIG. 4A, FIG. 5A, FIG. 6A, and FIG. 7A are plan views illustrating a process of manufacturing a light emitting device according to an exemplary embodiment. FIG. 2B, FIG. 3B, FIG. 4B, FIG. 5B, FIG. 6B, and FIG. 7B are schematic cross-sectional views taken along line C-C' of its corresponding plan view shown in FIG. 2A, FIG. 3A, FIG. 4A, FIG. 5A, FIG. 6A, and FIG. 7A.

The substrate 11 may include the protruding pattern P, and may be, for example, a patterned sapphire substrate. The first conductivity type semiconductor layer 41, the active layer 43, and the second conductivity type semiconductor layer 45, which form the third LED stack 40, may be sequentially grown on the substrate 11 by metal organic chemical vapor deposition (MOCVD) or molecular beam epitaxy (MBE). The third lower contact electrode 45p may be formed on the second conductivity type semiconductor layer 45 by physical vapor deposition or chemical vapor deposition, and may include a transparent conductive oxide (TCO), such as SnO, InO$_2$, ZnO, ITO, and ITZO. Then, the first stress relief layer 51 may be formed on the third lower contact electrode 45p. The first stress relief layer 51 may be formed of, for example, SiO$_2$. In an exemplary embodiment, the third LED stack 40 may emit green light.

Similarly, each of the first and second LED stacks 20 and 30 may be formed by sequentially growing the first conductivity type semiconductor layers 21 and 31, the active layers 23 and 33, and the second conductivity type semiconductor layers 25 and 35 on a temporary substrate. The first and second lower contact electrodes 25p and 35p including a transparent conductive oxide TCO may be formed on the second conductivity type semiconductor layers 25 and 35, respectively, by, for example, physical vapor deposition or chemical vapor deposition. Then, the second stress relief layer 53 may be formed on the second lower contact electrode 35p. The second stress relief layer 53 may be formed of, for example, SiO$_2$.

The second and third LED stacks 30 and 40 may be coupled to each other with the second adhesive layer 63 interposed therebetween, and the temporary substrate for the second LED stack 30 may be removed by a laser lift-off process, a chemical process, a mechanical process, or the like. The first LED stack 20 may be coupled to the second LED stack 30 with the first adhesive layer 61 interposed therebetween, and the temporary substrate for the first LED stack 20 may be removed by a laser lift-off process, a chemical process, a mechanical process, or the like.

In the course of bonding the different LED stacks 20, 30, and 40 to one another and removing the temporary substrates for the first and second LED stacks 20 and 30, the substrate 11 may warp due to different thermal expansion coefficients of the LED stacks 20, 30, and 40, which may cause generation of cracks between the LED stacks 20, 30, and 40. The first and second stress relief layers 51 and 53 disposed between the LED stacks 20, 30, and 40 may prevent or at least suppress generation of defects, such as cracks, between LED stacks 20, 30, and 40.

Figure 2A:
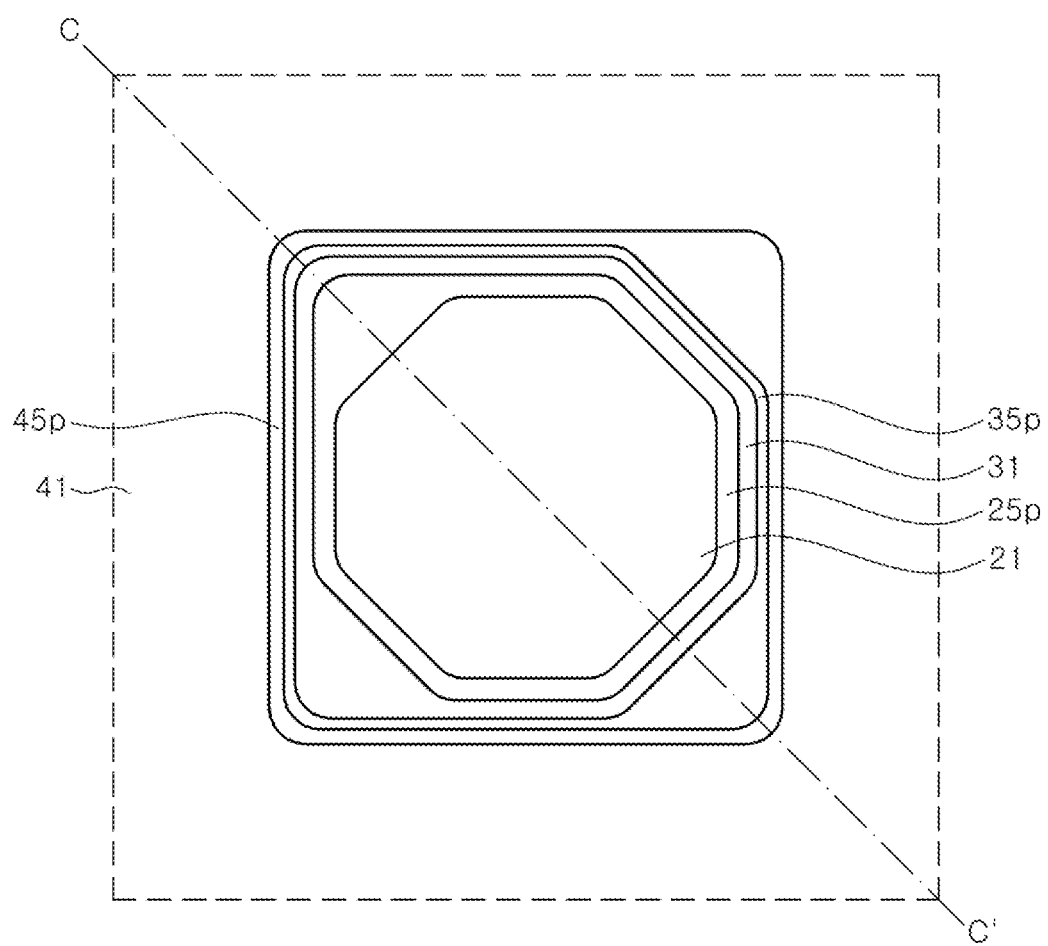
FIG. 2A, FIG. 3A, FIG. 4A, FIG. 5A, FIG. 6A, and FIG. 7A are plan views illustrating a method of manufacturing a light emitting device according to an exemplary embodiment.
Figure 2B:
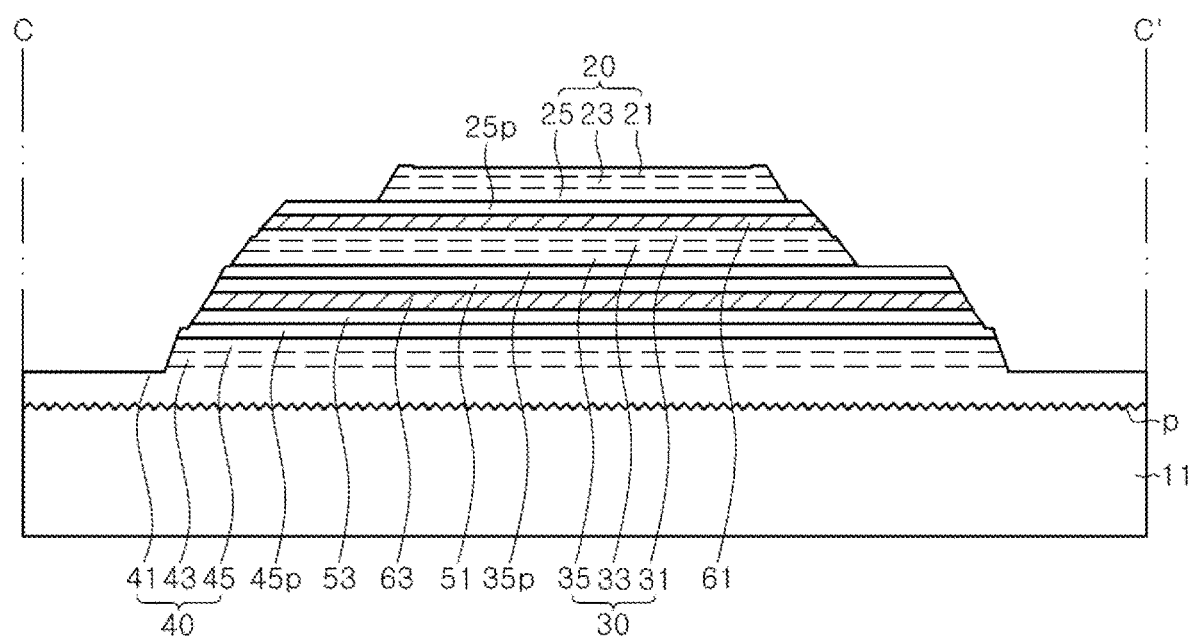
FIG. 2B, FIG. 3B, FIG. 4B, FIG. 5B, FIG. 6B, and FIG. 7B are schematic cross-sectional views taken along line C-C' of its corresponding plan view shown in FIG. 2A, FIG. 3A, FIG. 4A, FIG. 5A, FIG. 6A, and FIG. 7A.

Referring to FIG. 2A and FIG. 2B, various portions of each of the first, second, and third LED stacks 20, 30, and 40 may be patterned by etching or the like to at least partially expose the first conductivity type semiconductor layer 21 of the first LED stack 20, the first lower contact electrode 25p, the first conductivity type semiconductor layer 31 of the second LED stack 30, the second lower contact electrode 35p, the third lower contact electrode 45p, and the first conductivity type semiconductor layer 41 of the third LED stack 40.

The first LED stack 20 may have the smallest area among the LED stacks 20, 30, and 40. The third LED stack 40 may have the largest area among the LED stacks 20, 30, and 40. Accordingly, the intensity of light emitted from the third LED stack 40 may be relatively high. However, the inventive concepts are not limited thereto, and relative sizes between the LED stacks 20, 30, and 40 may be changed in various manners in other exemplary embodiments.

Figure 3A:
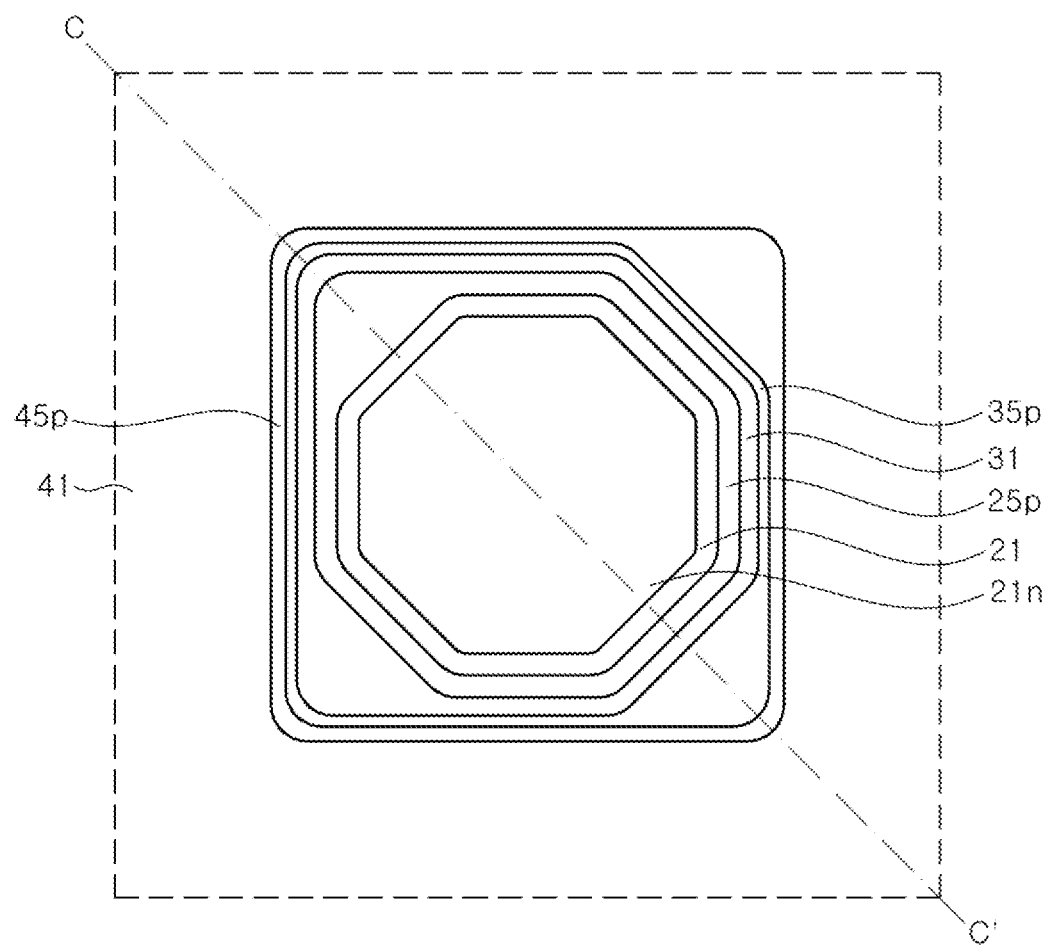
Figure 3B:
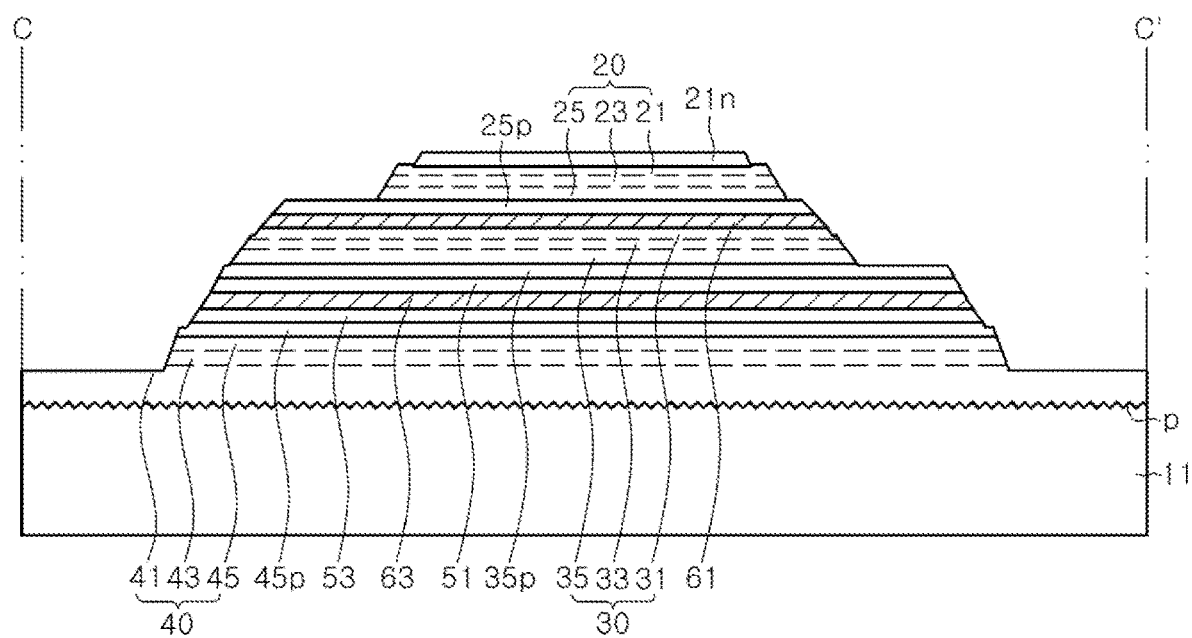

Referring to FIG. 3A and FIG. 3B, a portion of the upper surface of the first conductivity type semiconductor layer 21 of the first LED stack 20 may be surface-treated by wet etching or the like to form the first upper contact electrode 21n. The surface-treated region may be etched to a sufficient thickness by over-etching. Accordingly, the first conductivity type semiconductor layer 21 may have a smaller thickness in a region in which the first upper contact electrode 21n is to be formed than the remaining regions of the first conductivity type semiconductor layer 21. The first upper contact electrode 21n may be formed to have a thickness of about 100 nm in the patterned region of the first conductivity type semiconductor layer 21 to improve an ohmic contact with the first conductivity type semiconductor layer 21.

Figure 4A:
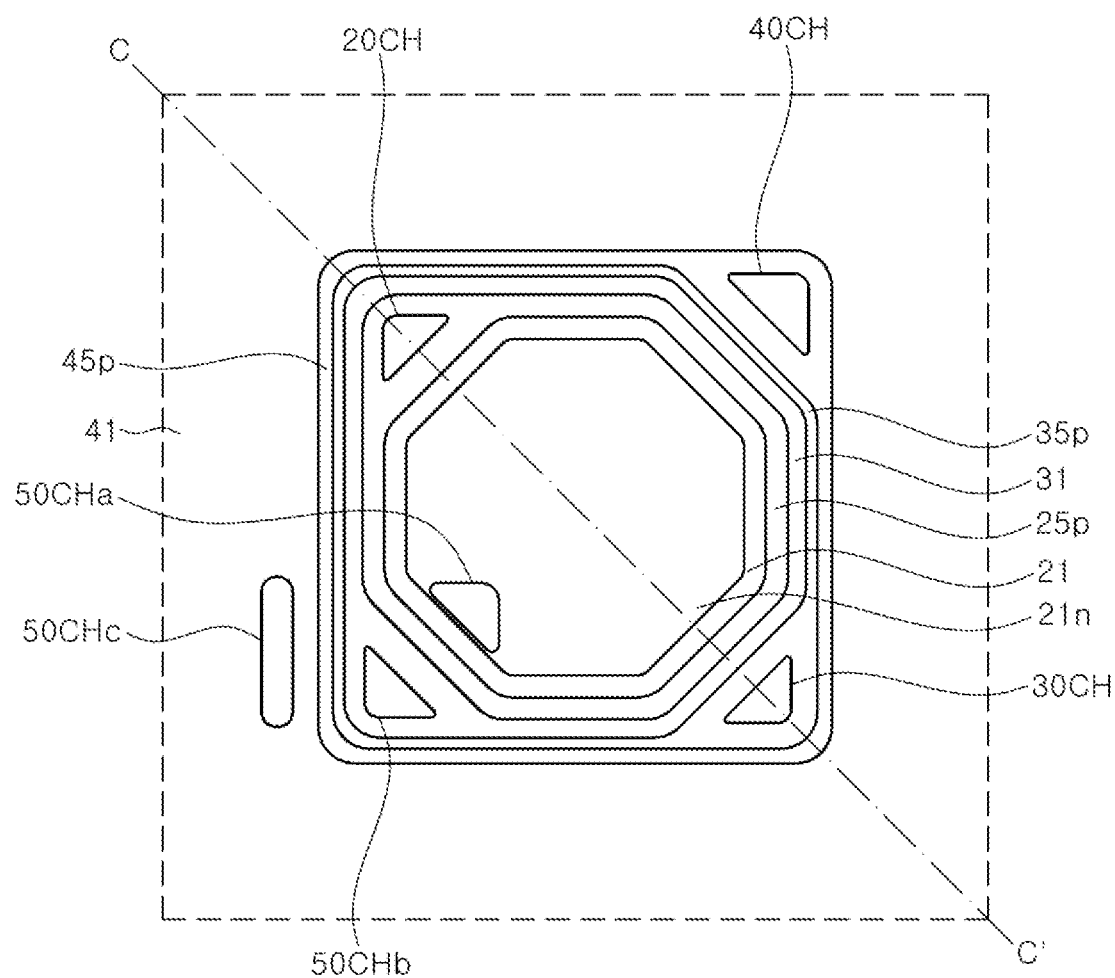
Figure 4B:
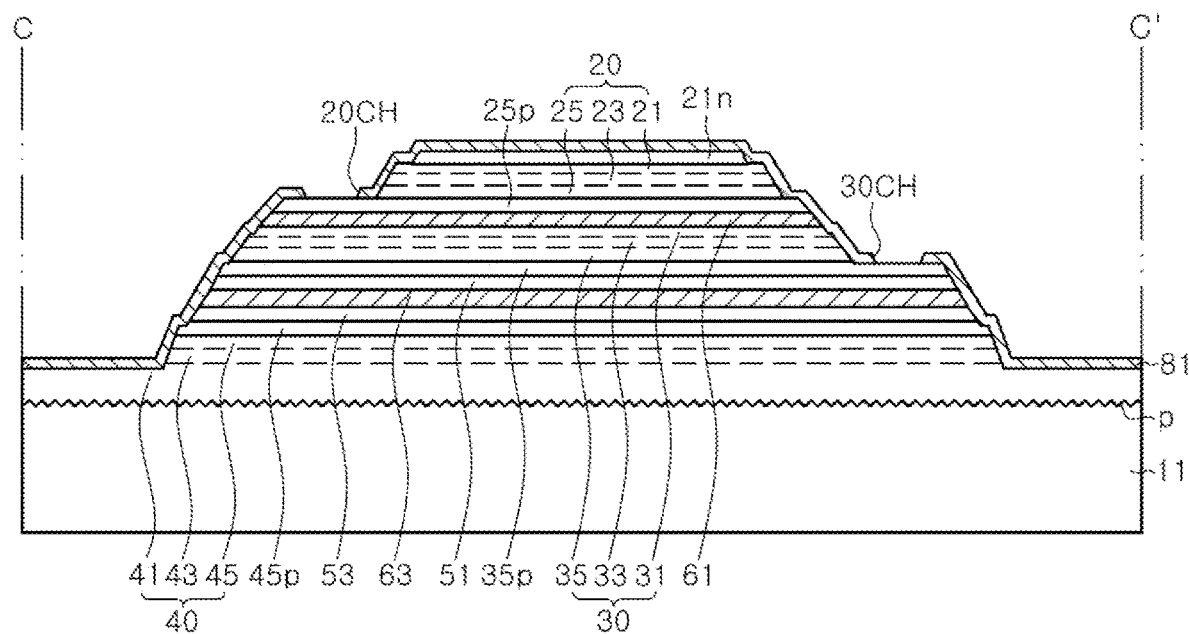

Referring to FIG. 4A and FIG. 4B, the first insulation layer 81 may be formed so as to cover upper and side surfaces of the LED stacks 20, 30, and 40. At least a portion of the first insulation layer 81 may be removed so as to form the first, second, third, and fourth contact holes 20CH, 30CH, 40CH, and 50CH.

The first contact hole 20CH may be formed in the first insulation layer 81 to expose a portion of the first lower contact electrode 25p. The second contact hole 30CH may be formed in the first insulation layer 81 to expose a portion of the second lower contact electrode 35p. The third contact hole 40CH may be formed in the first insulation layer 81 to expose a portion of the third lower contact electrode 45p. The fourth contact hole 50CH may include a first sub-contact hole 50CHa, a second sub-contact hole 50CHb, and a third sub-contact hole 50CHc, which expose the first conductivity type semiconductor layers 21, 31, and 41 of the first to third LED stacks 20, 30, and 40, respectively.

Figure 5A:
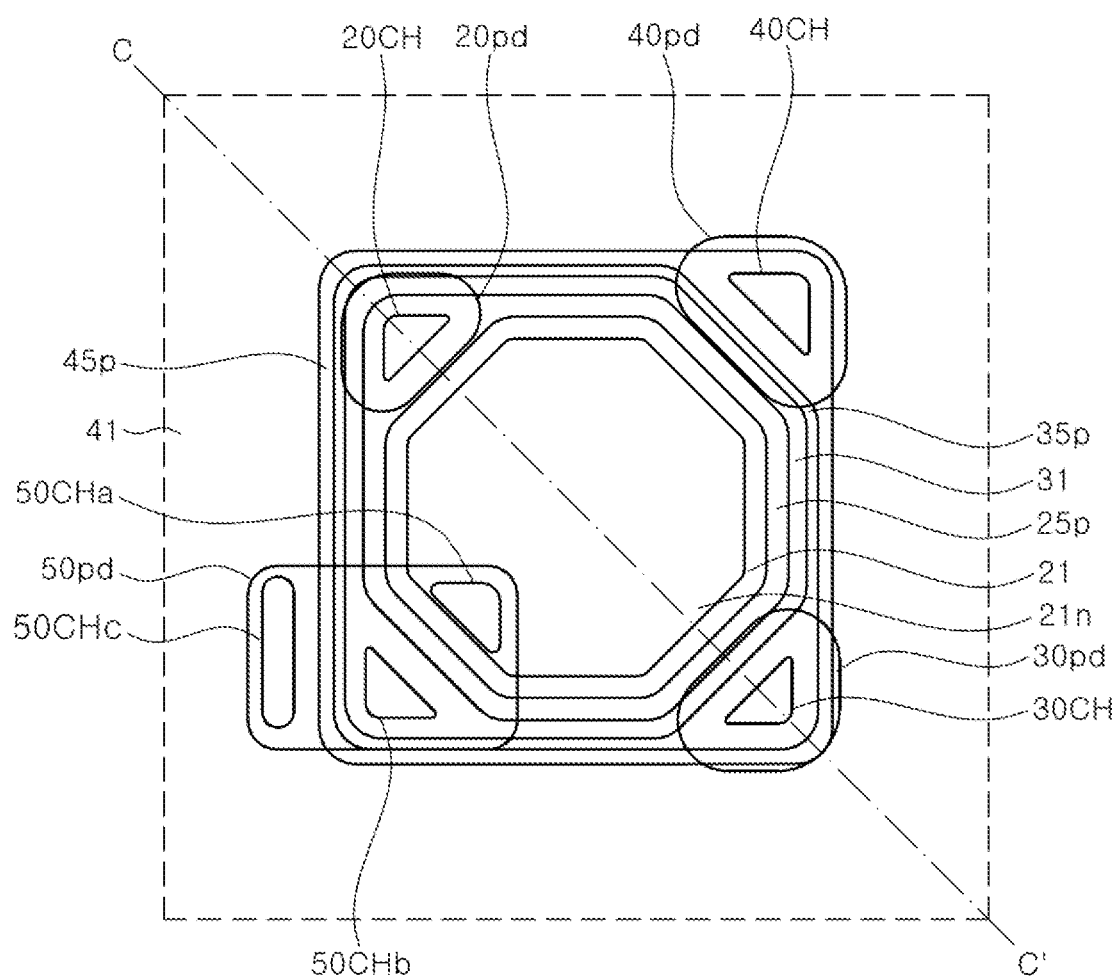
Figure 5B:
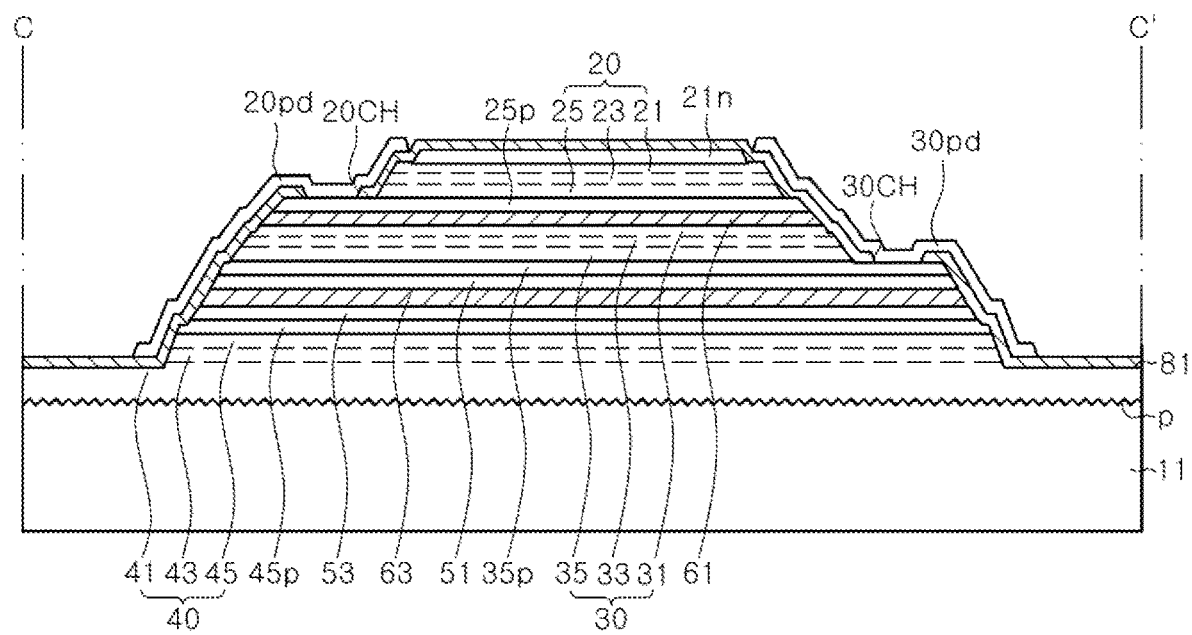

Referring to FIG. 5A and FIG. 5B, the first, second, third, and fourth electrode pads 20pd, 30pd, 40pd, and 50pd may be formed on the first insulation layer 81 having the first, second, third, and fourth contact holes 20CH, 30CH, 40CH, and 50CH. For example, the first, second, third, and fourth electrode pads 20pd, 30pd, 40pd, and 50pd may be formed by forming a conductive layer on an entire structure shown in FIG. 4A, patterning the conductive layer by photolithography, and depositing and lifting off metal on the patterned conductive layer.

The first electrode pad 20pd may be formed so as to overlap with a region in which the first contact hole 20CH is formed, and the first electrode pad 20pd may be connected to the first lower contact electrode 25p through the first contact hole 20CH. The second electrode pad 30pd may be formed so as to overlap with a region in which the second contact hole 30CH is formed, and the second electrode pad 30*pd* may be connected to the second lower contact electrode 35*p* through the second contact hole 30CH. The third electrode pad 40*pd* may be formed so as to overlap with a region in which the third contact hole 40CH is formed, and the third electrode pad 40*pd* may be connected to the lower contact electrode 45*p* through the third contact hole 40CH. The fourth electrode pad 50*pd* may be formed so as to overlap with a region where the fourth contact hole 50CH is formed, in particular, a region where the first, second, and third sub-contact holes 50CHa, 50CHb, and 50CHc are formed, and the fourth electrode pad 50*pd* may be connected to the first conductivity type semiconductor layers 21, 31, and 41 of each of the first, second, and third LED stacks 20, 30, and 40.

Figure 6A:
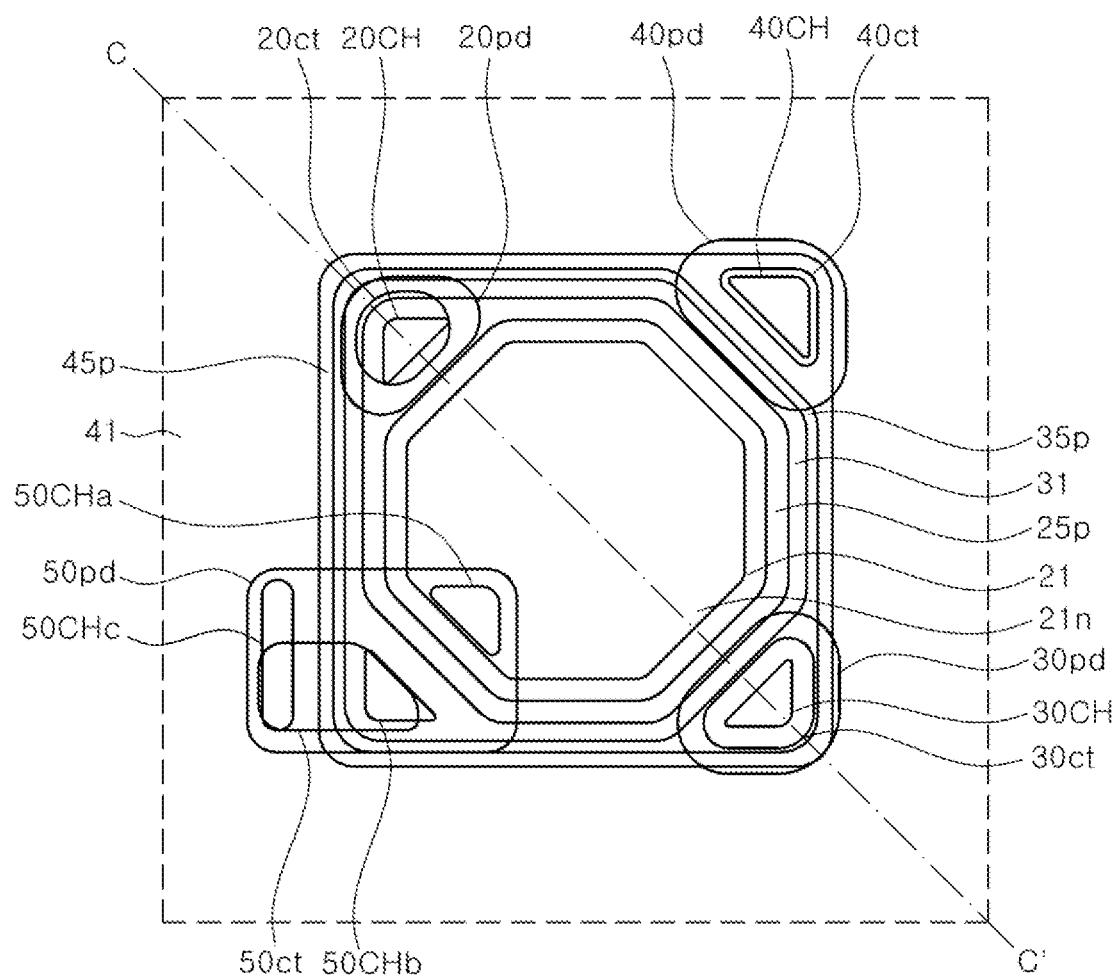
Figure 6B:
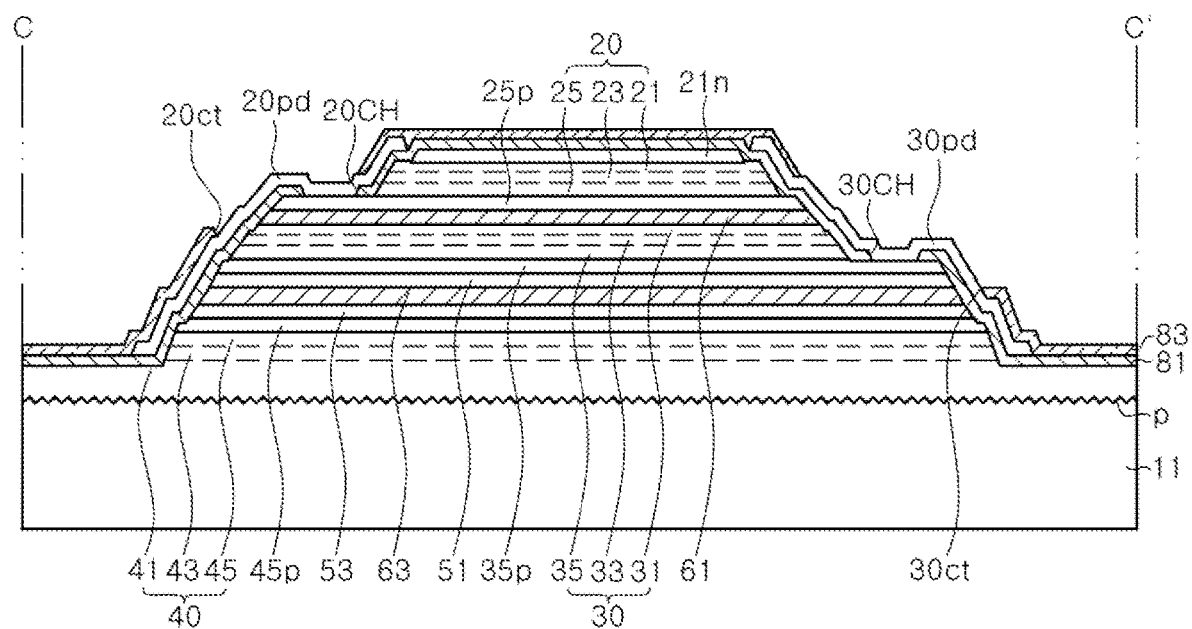

Referring to FIG. 6A and FIG. 6B, the second insulation layer 83 may be formed on the first insulation layer 81. The first insulation layer 81 may include a silicon oxide-based material and the second insulation layer 83 may include a distributed Bragg reflector (DBR), without being limited thereto. Then, the second insulation layer 83 may be patterned to form the first, second, third, and fourth through-holes 20*ct*, 30*ct*, 40*ct*, and 50*ct*.

The first through-hole 20*ct* formed in the second insulation layer 82 may expose at least a portion of the first electrode pad 20*pd*. The second through-hole 30*ct* formed in the second insulation layer 82 may expose at least a portion of the second electrode pad 30*pd*. The third through-hole 40*ct* formed in the second insulation layer 82 may expose at least a portion of the third electrode pad 40*pd*. The fourth through-hole 50*ct* formed on the fourth electrode pad 50*pd* may expose at least a portion of the fourth electrode pad 50*pd*. The first, second, third, and fourth through-holes 20*ct*, 30*ct*, 40*ct*, and 50*ct* may be defined in regions in which the first, second, third, and fourth electrode pads 20*pd*, 30*pd*, 40*pd*, and 50*pd* are formed, respectively.

Figure 7A:
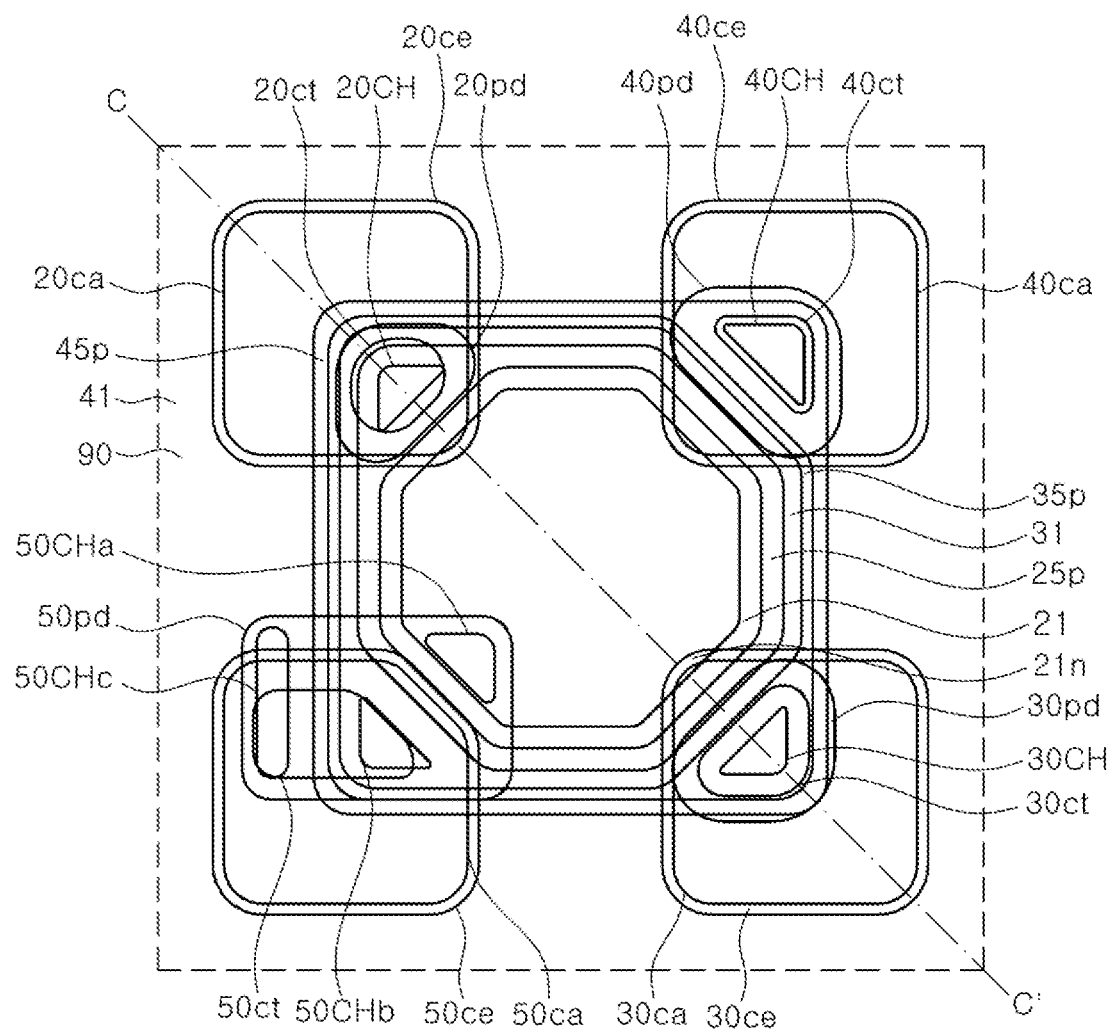
Figure 7B:
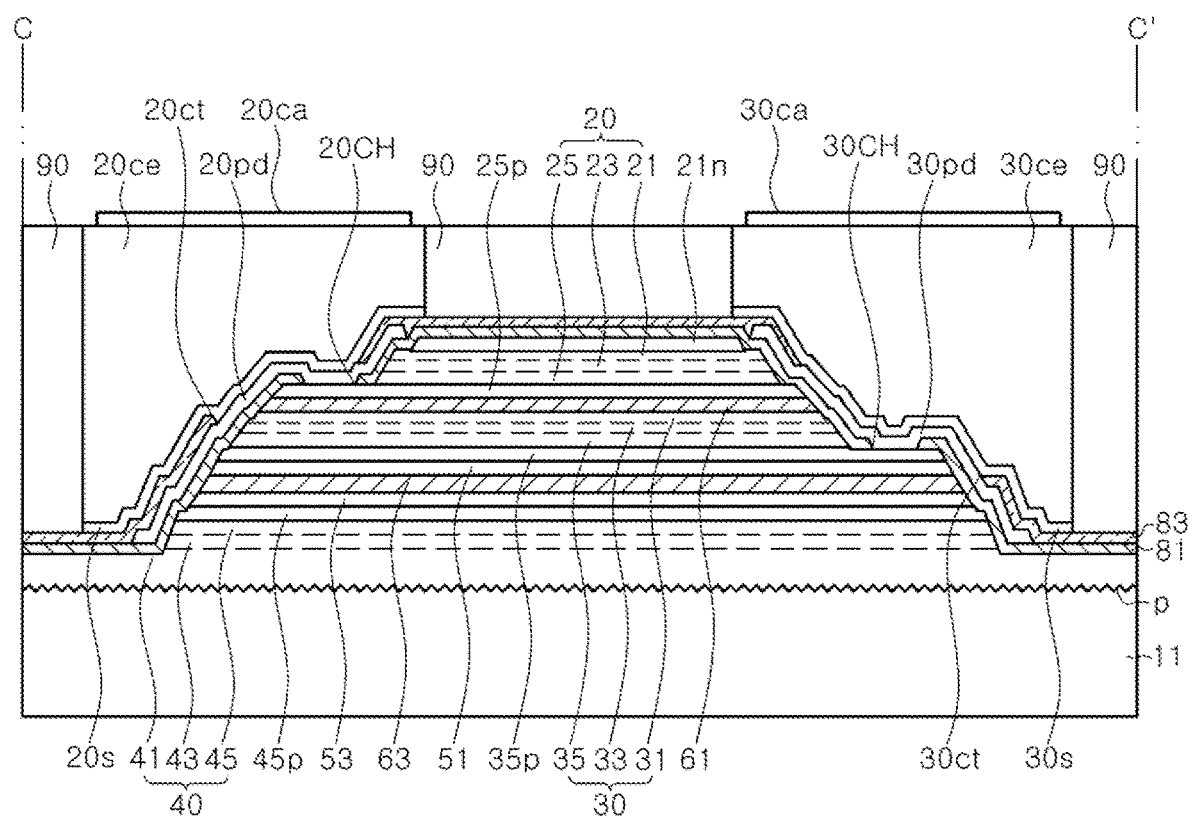

Referring to FIG. 7A and FIG. 7B, the first, second, third, and fourth connection electrodes 20*ce*, 30*ce*, 40*ce*, and 50*ce* may be connected to the electrode pads 20*pd*, 30*pd*, 40*pd*, and 50*pd*, respectively. With the electrode pads 20*pd*, 30*pd*, 40*pd*, and 50*pd* partially exposed through the first, second, third, and fourth through-holes 20*ct*, 30*ct*, 40*ct*, and 50*ct*, respectively, the seed layers 20*s*, 30*s*, 40*s*, and 50*s* may be deposited on the first, second, and third sub-units 2, 3, and 4 as conductive surfaces. The seed layers 20*s*, 30*s*, 40*s*, and 50*s* may be patterned by photolithography or the like to be disposed at locations where the connection electrodes are to be is formed.

Each of the seed layers 20*s*, 30*s*, 40*s*, and 50*s* may be deposited to a thickness of about 1,000 ∈, without being limited thereto. Each of the seed layers 20*s*, 30*s*, 40*s*, and 50*s* may be formed of, for example, Ti/Cu. Then, the first, second, third, and fourth connection electrodes 20*ce*, 30*ce*, 40*ce*, and 50*ce* may be formed on the seed layers 20*s*, 30*s*, 40*s*, and 50*s*, respectively, by plating the seed layers with metal, such as Cu, Ni, Ti, Sb, Zn, Mo, Co, Sn, and Ag, or an alloy thereof.

In addition, in order to prevent oxidation of the metal plating, the protection metal layers 20*ca*, 30*ca*, 40*ca*, and 50*ca* may be further disposed on the first, second, third, fourth connection electrodes 20*ce*, 30*ce*, 40*ce*, and 50*ce*, respectively. The protection metal layers 20*ca*, 30*ca*, 40*ca*, and 50*ca* may be deposited on or added to the metal plating by electroless nickel immersion gold (ENIG) or the like.

Each of the first to fourth connection electrodes 20*ce*, 30*ce*, 40*ce*, and 50*ce* may have the elongated shape in the vertical direction of the substrate 11. In addition, each of the first to fourth connection electrodes 20*ce*, 30*ce*, 40*ce*, and 50*ce* may include two or more different metals or metal layers so as to reduce stress due to the elongated shape thereof. However, the inventive concepts are not limited thereto, and in some exemplary embodiments, the first to fourth connection electrodes 20*ce*, 30*ce*, 40*ce*, and 50*ce* may have various other shapes.

Each of the first to fourth connection electrodes 20*ce*, 30*ce*, 40*ce*, and 50*ce* may have a flat upper surface so as to facilitate electrical connection between the first, second, third sub-units 2, 3, and 4 and an external line or electrode. Accordingly, each of the first to fourth connection electrodes 20*ce*, 30*ce*, 40*ce*, and 50*ce* may have a lower surface having a larger is surface area than its upper surface to secure a sufficient contact area between the first to fourth connection electrodes 20*ce*, 30*ce*, 40*ce*, and 50*ce* and the first, second, and third sub-units 2, 3, and 4, thereby providing a stable structure that allows the first, second, and third sub-units 2, 3, and 4 to withstand subsequent processes in conjunction with the protection layer 90.

The protection layer 90 may be disposed between the first to fourth connection electrodes 20*ce*, 30*ce*, 40*ce*, and 50*ce*. The protection layer 90 may be formed to be substantially flush with to the upper surface of each of the first to fourth connection electrodes 20*ce*, 30*ce*, 40*ce*, and 50*ce* by polishing or the like. In an exemplary embodiment, the protection layer 90 may include a black epoxy molding compound (EMC), without being limited thereto. For example, the protection layer 90 may include a photosensitive polyimide dry film (PID). Accordingly, the protection layer 90 not only protects the first, second, and third sub-units 2, 3, and 4 from possible external impacts during a subsequent process, but also may secure a sufficient contact area of the first, second, and third sub-units 2, 3, and 4 so as to facilitate s handling during a subsequent transferring process. The protection layer 90 may be transparent or may have various colors, such as black, white, and or others, and further, the protection layer 90 may prevent light leakage through the side surface of the light emitting device 100, thereby preventing or suppressing interference of light emitted from adjacent light emitting devices 100.

Figure 8:
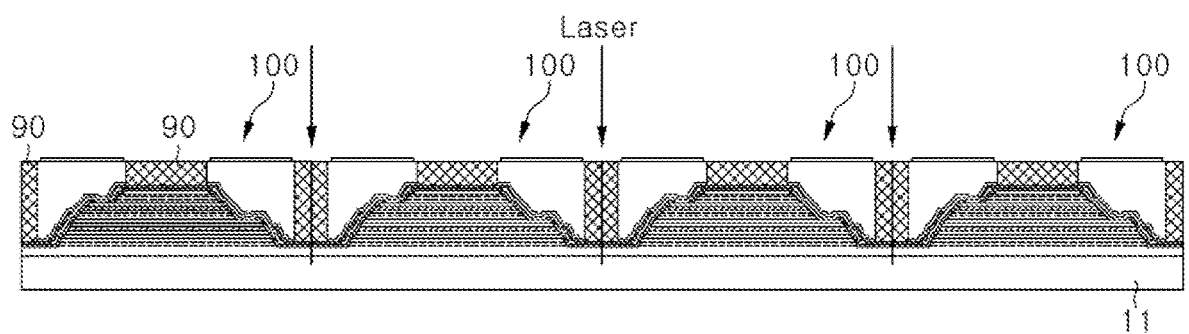
FIG. 8, FIG. 9, FIG. 10, FIG. 11, FIG. 12, FIG. 13, and FIG. 14 are schematic cross-sectional views illustrating a process of manufacturing a light emitting device according to an exemplary embodiment.
Figure 9:
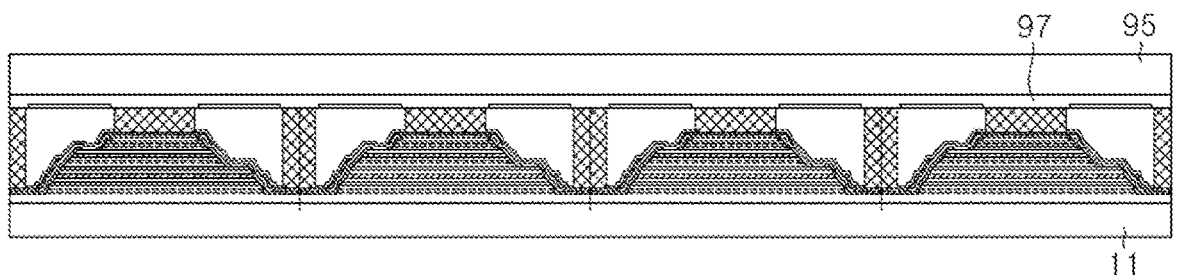

Referring to FIG. 8 and FIG. 9, the plurality of light emitting devices 100 is formed on the substrate 11, and a process of separating the light emitting devices 100 into individual light emitting devices 100 may be performed. A singulation process for obtaining individual light emitting devices 100 may be carried out by a temporary bonding/debonding (TB/DB) process using a temporary adhesive substrate. More particularly, separation lines that partially separate the light emitting devices 100 from one another may be formed between the light emitting devices 100 by application of laser beams. The laser beams may be applied from a top of the light emitting device 100 towards the protection layer 90. Hereinafter, the protection metal layers 20*ca*, 30*ca*, 40*ca*, and 50*ca* may be collectively illustrated and described as the connection electrodes 20*ce*, 30*ce*, 40*ce*, and 50*ce*, respectively, or vice versa.

Subsequently, a temporary substrate 95 may be attached to the connection electrodes 20*ce*, 30*ce*, 40*ce*, and 50*ce* and the protection layer 90 through the bonding layer 97.

The temporary substrate 95 may be formed of the same material as the substrate 11, and may be, for example, a sapphire substrate, without being limited thereto.

The bonding layer 97 may be a UV curable tape, without being limited thereto, or the bonding layer 97 may include a UV curable film, a thermal release tape, and an adhesive. The bonding layer 97 may be bonded to the light emitting device 100 by vacuum lamination. The bonding layer 97 may be formed first on the temporary substrate 95, or may be formed first on the light emitting device 100.

The temporary substrate 95 may be attached to facilitate subsequent grinding and lapping processes. According to an exemplary embodiment, the substrate 11 may be thinned through a thinning process, and for example, the thickness of the substrate 11 may be reduced to about 50 μm or 30 μm. The thinning process may be performed through grinding and lapping processes, and in this case, distortion or warpage of the substrate 11 may occur due its small thickness after the grinding and lapping processes. As such, by attaching the temporary substrate 95, it is possible to facilitate handling of the substrate 11 after the grinding and lapping processes.

Figure 10:
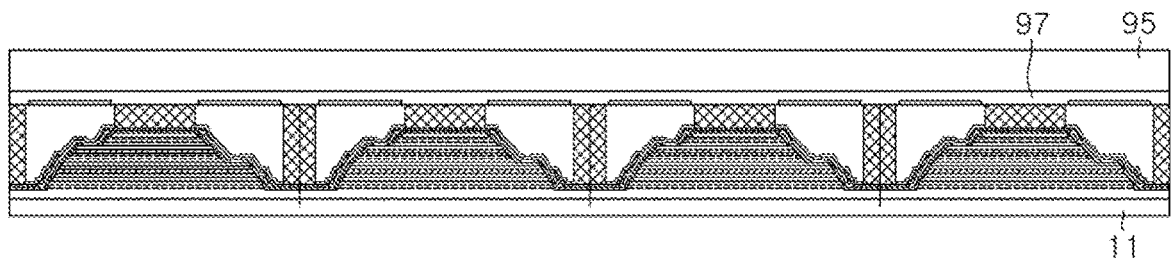
Figure 11:
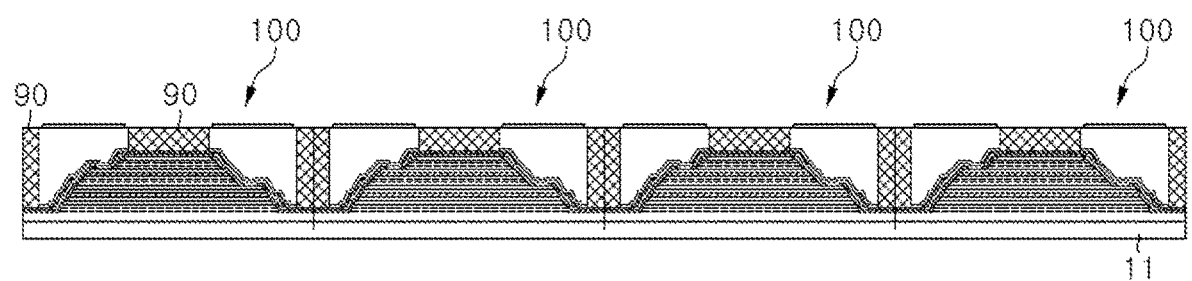

Referring to FIG. 10 and FIG. 11, with the temporary substrate 95 attached to the light emitting device 100, a thickness of the substrate 11 may be reduced to a desired thickness is by grinding and lapping processes. According to an exemplary embodiment, the thickness of the substrate 11 may be about 180 μm or less, further 150 μm, or less, furthermore 100 μm or less, and in a particular exemplary embodiment, it may be 50 μm or less, further 30 μm or less, without being limited thereto, or it may have various thicknesses depending on an intended use. Moreover, in some exemplary embodiments, the substrate 11 may be separated from the light emitting device 100. Thereafter, the temporary substrate 95 may be removed from the light emitting device 100 by application of ultraviolet rays or the like.

Figure 12:
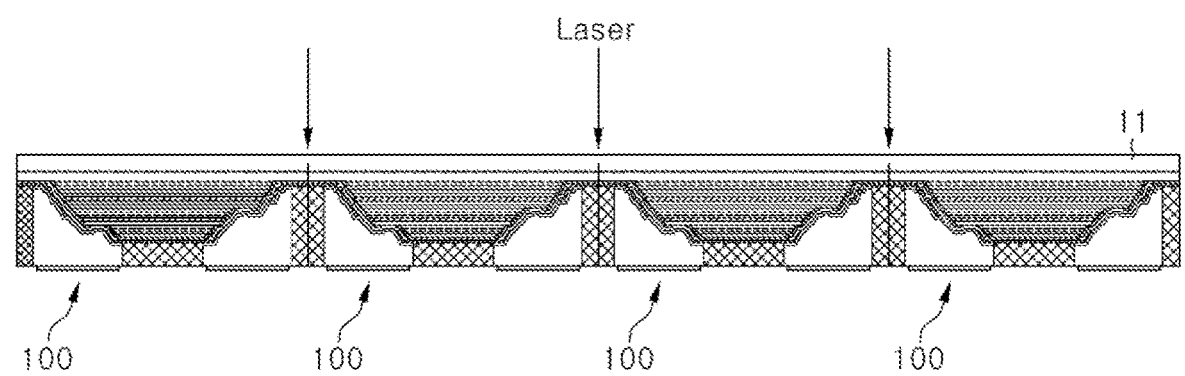
Figure 13:
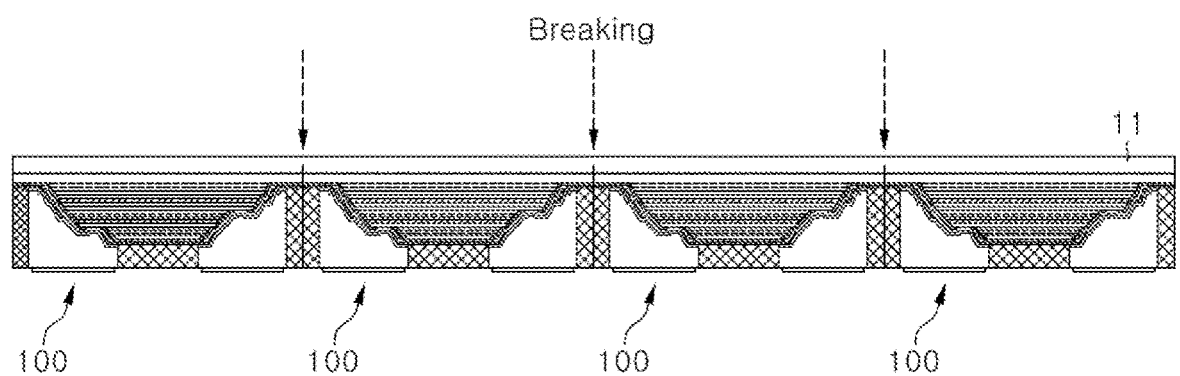
Figure 14:
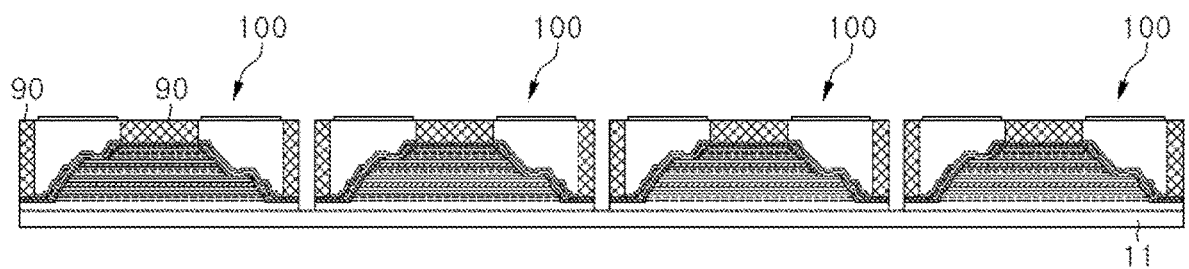
Figure 15:
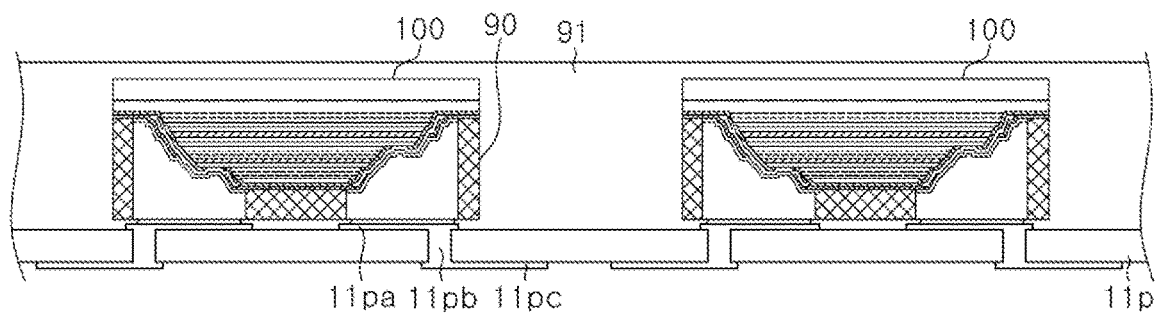
FIG. 15, FIG. 16A, FIG. 16B, and FIG. 17 are schematic cross-sectional views and a plan view illustrating a process of manufacturing a light emitting module according to an exemplary embodiment.

Referring to FIG. 12, FIG. 13, and FIG. 14, additional separation lines may be formed between the light emitting devices 100 by application of laser beams to partially separate the light emitting devices 100 from one another. Here, the laser beams may be applied from a bottom of the light emitting device 100 towards the substrate 11 (or from the top when the light emitting device 100 is flipped over as shown in FIG. 12). Then, the substrate 11 may be cut or broken to obtain individual light emitting devices 100. For example, the substrate 11 may be cut by dicing along previously formed scribe lines, or may be split by application of mechanical force along the separation lines formed during the laser process. Although the cutting process may be carried on the substrate 11 side, the inventive concepts are not limited thereto.

FIG. 15, FIG. 16A, FIG. 16B, and FIG. 17 are cross-sectional views and a plan view illustrating a manufacturing process of a light emitting module according to an exemplary embodiment.

The light emitting device 100 may be mounted on a circuit board 11p. The circuit board 11p may include an upper circuit electrode 11pa, a lower circuit electrode 11pc, and an intermediate circuit electrode 11pb, which are electrically connected to one another. The upper circuit electrode 11pa may be mounted to correspond to each of the first, second, third, and fourth connection electrodes 20ce, 30ce, 40ce, and 50ce. The circuit board 11p may be formed with any material, such as a conductive circuit board, a printed circuit board, polyimide, or the like, so long as the light emitting device 100 can be mounted thereon.

The first, second, third, and fourth connection electrodes 20ce, 30ce, 40ce, and 50ce of the light emitting device 100 may be bonded to the upper circuit electrode 11pa of the circuit board 11p using a bonding agent. The bonding agent may be solder, for example. The light emitting device 100 may be bonded to the circuit board 11p by placing a solder paste on the upper circuit electrode 11pa of the circuit board 11p by screen printing, followed by a reflow process. However, the inventive concepts are not limited thereto, and in other exemplary embodiments, the light emitting device 100 may be connected to the circuit board 11p by eutectic bonding, epoxy bonding, anisotropic conductive film (ACF) bonding, ball grid array (BGA) bonding, or the like.

Figure 16A:
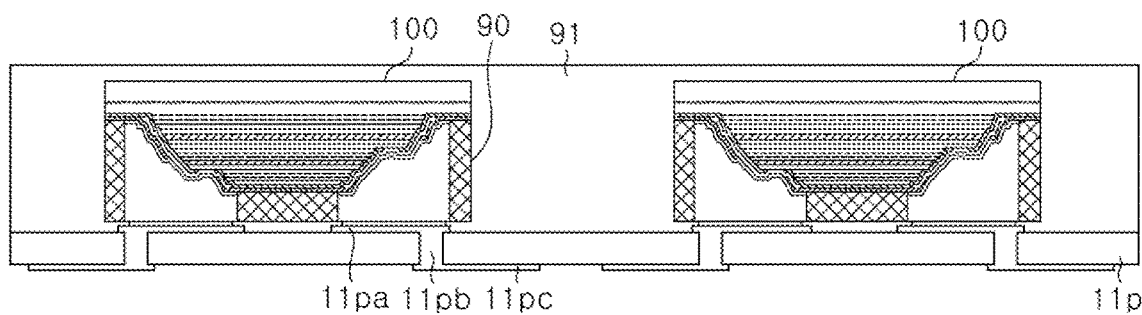
Figure 16B:
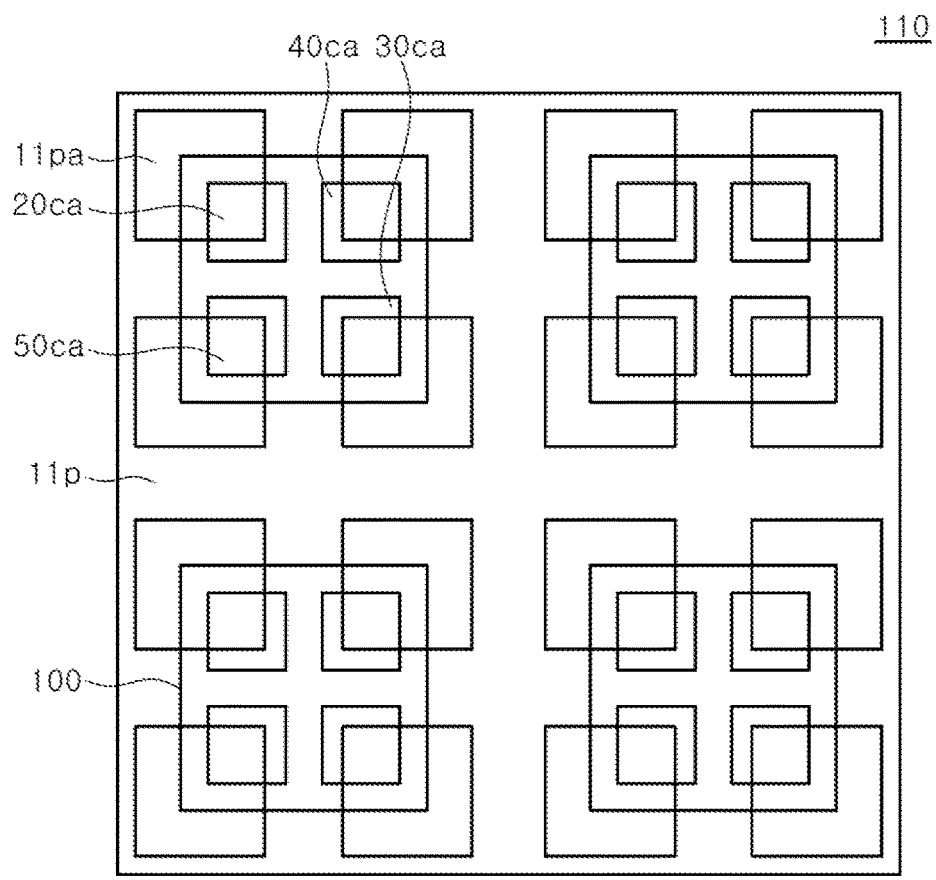

Referring to FIG. 16A and FIG. 16B, a molding layer 91 may be formed between the light emitting devices 100. The molding layer 91 may transmit at least a portion of light emitted from the light emitting device 100, and may reflect, diffract, and absorb a portion of external light so as to prevent the external light from being reflected from the light emitting device 100 in a direction visible to a user. In addition, the molding layer 91 may cover at least a portion of the light emitting device 100 to protect the light emitting device 100 from moisture and external impact. Further, the molding layer 91 may protect the light emitting module in conjunction with the protection layer 90 formed on the light emitting device 100.

The molding layer 91 may further include fillers, such as silica, $TiO_2$, alumina, and the like. In addition, the molding layer 91 may include the same material as the protection layer 90.

The molding layer 91 may be formed by lamination, inkjet printing, or the like. For example, the molding layer 91 may be formed by placing an organic polymer sheet on the light emitting device 100, followed by vacuum lamination using application of high temperature and high pressure under a vacuum. In this manner, the molding layer 91 may improve optical uniformity by forming a flat upper surface of the light emitting module.

The molding layer 91 may be formed so as to cover all of the upper surface and the side surfaces of the light emitting device 100. The molding layer 91 may be formed of a transparent molding layer or a black matrix molding layer including a light absorbing material to prevent light diffusion.

In another exemplary embodiment, the molding layer 91 may be formed between the light emitting devices 100 and exposes at least a part of the upper surface of the light emitting device 100 without covering the upper surface of the light emitting device 100, and may include a light absorbing material (e.g., a black matrix) so as to effectively block light. An upper s surface of the molding layer 91 may have a shape in which a thickness thereof becomes smaller as being disposed further away from the side surface of the light emitting device 100, that is, a downward concave shape. Accordingly, it is possible to prevent a dark portion from becoming clear due to the black matrix formed in a region between the light emitting devices 100.

In some exemplary embodiments, an additional molding layer may be formed so as to cover the upper surfaces of the molding layer 91 and the light emitting device 100, and the additional molding layer may be a light-transmitting molding layer, which may be a transparent molding layer.

The light emitting device 100 disposed on the circuit board 11p may be cut into a structure suitable for an intended use to form a light emitting module 110. FIG. 16B shows the is light emitting module 110 including four light emitting devices 100 disposed on the circuit board 11p. However, the inventive concepts are not limited thereto, and the light emitting module 110 may be configured to include one or more light emitting devices 100. In addition, although 2×2 light emitting devices 100 may be arranged on the circuit board 11p, the inventive concepts are not limited thereto, and the light emitting module 110 may include light emitting devices arranged in matrix of any number of rows and columns (n×m, n=1, 2, 3, 4, . . . , m=1, 2, 3, 4, . . . ) in other exemplary embodiments. The circuit board 11p may include a scan line and a data line for individually operating each light emitting device 100 included in the light emitting module 110.

Figure 17:
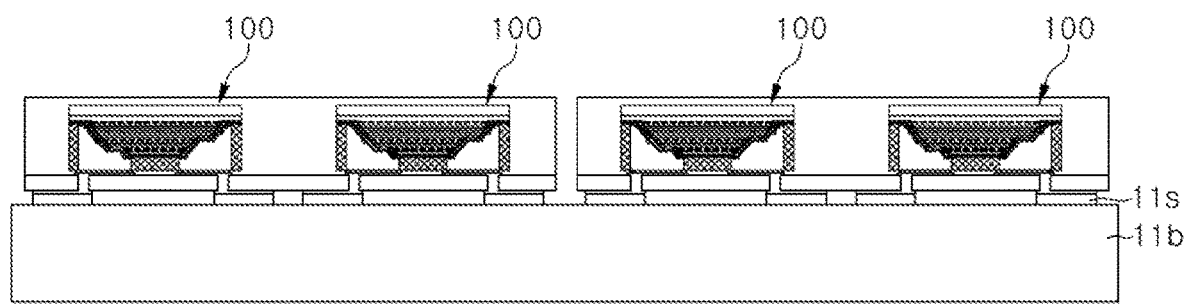
Figure 18A:
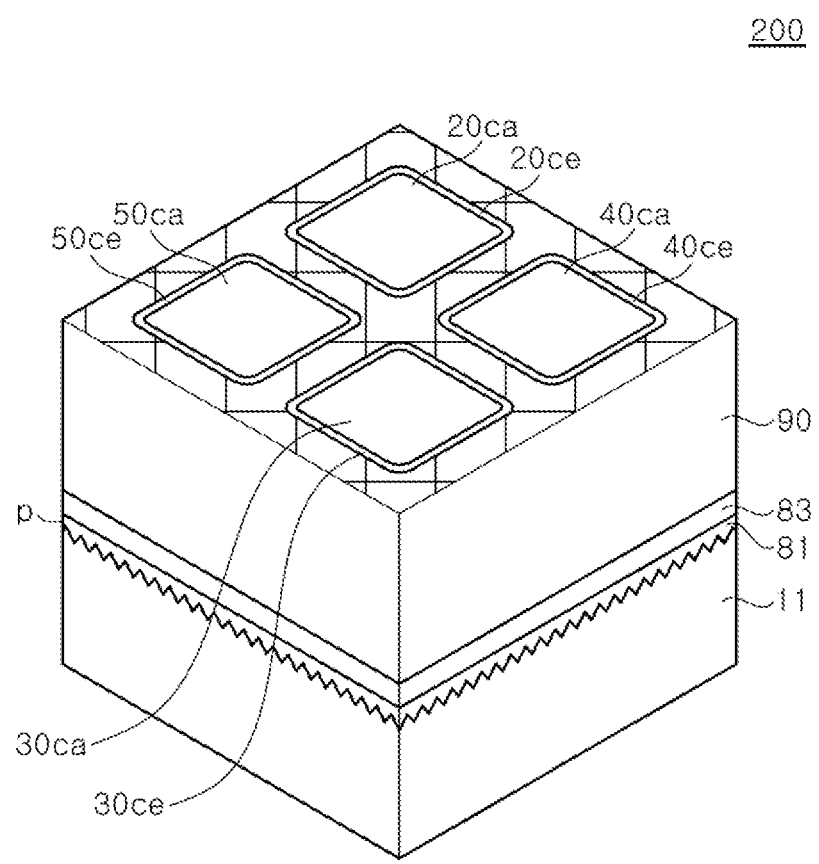
FIG. 18A is a schematic perspective view of a light emitting device according to another exemplary embodiment.
Figure 18B:
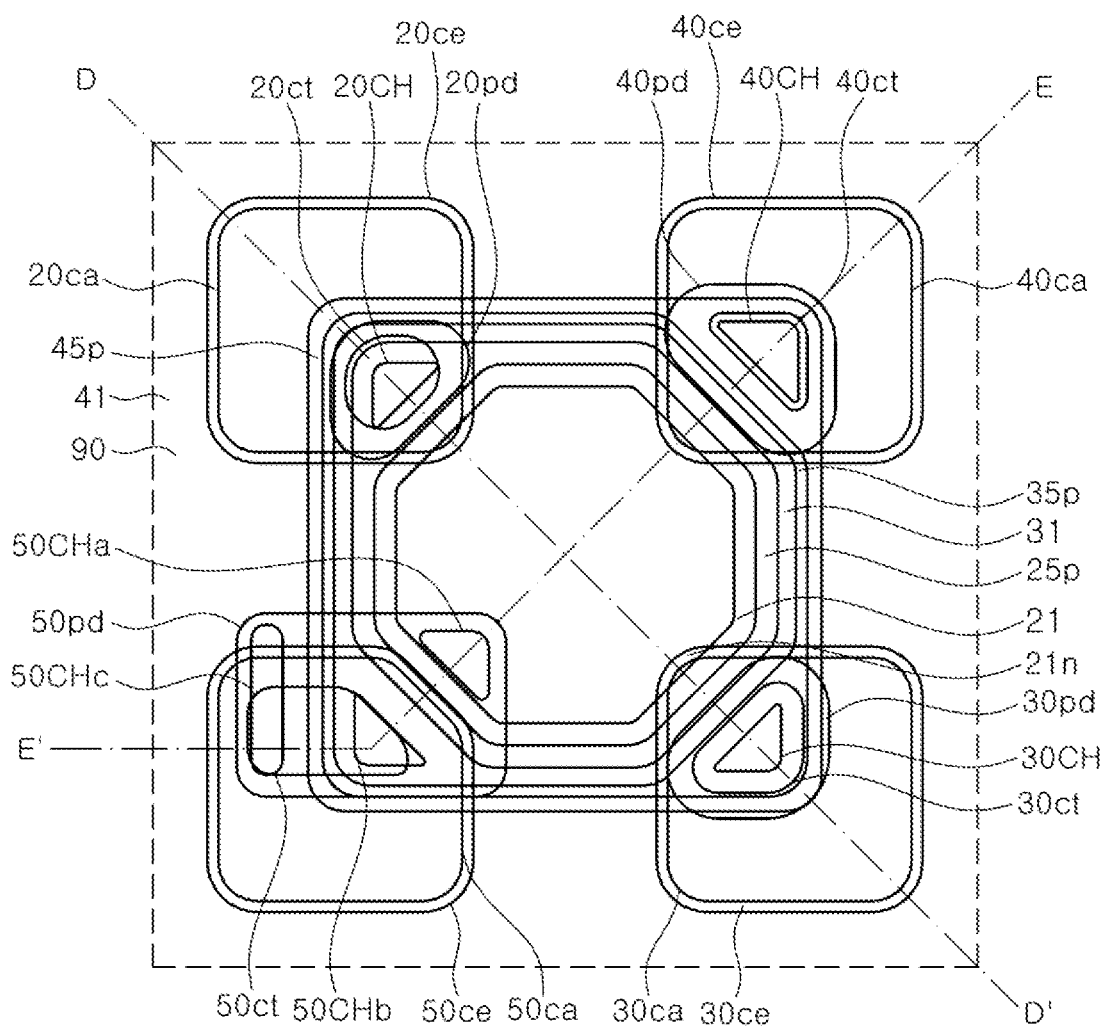
FIG. 18B is a schematic plan view of the light emitting device according to an exemplary embodiment.
Figure 18C:
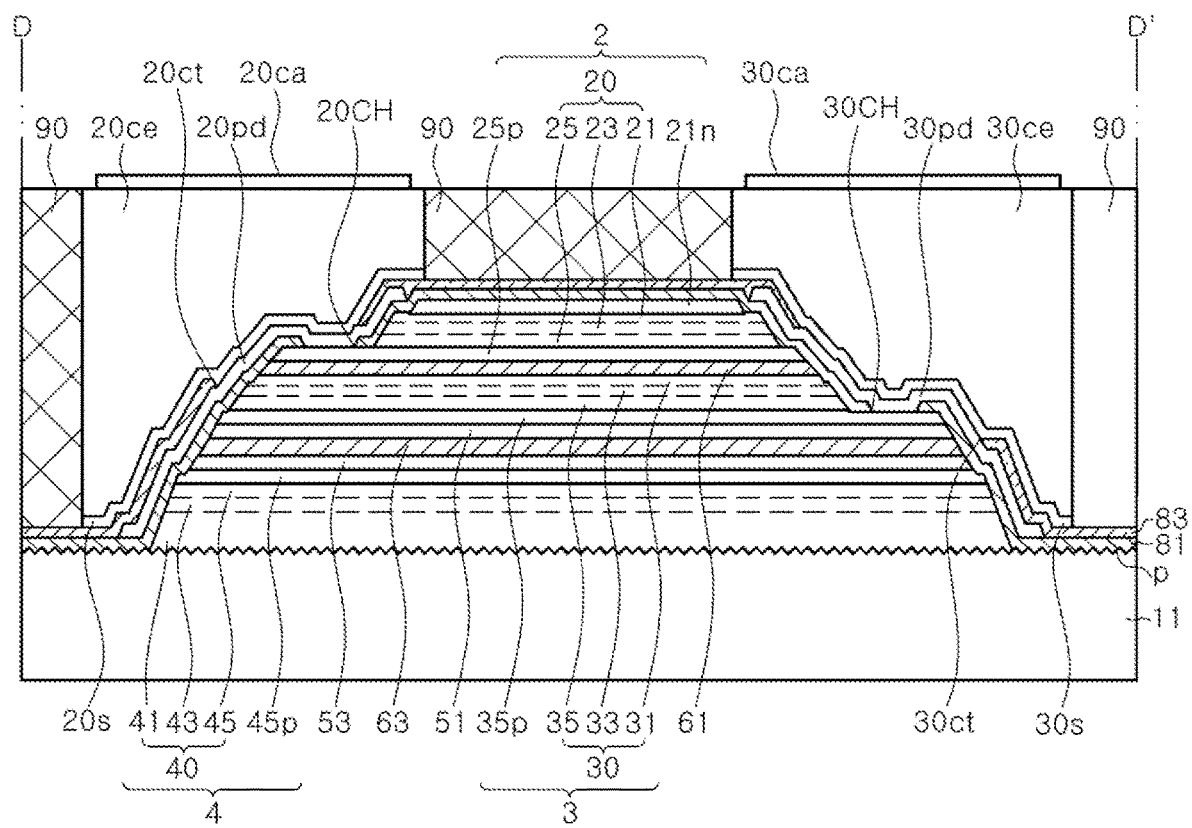
FIG. 18C is a schematic cross-sectional view taken along line D-D' of its corresponding plan view shown in FIG. 18B.
Figure 18D:
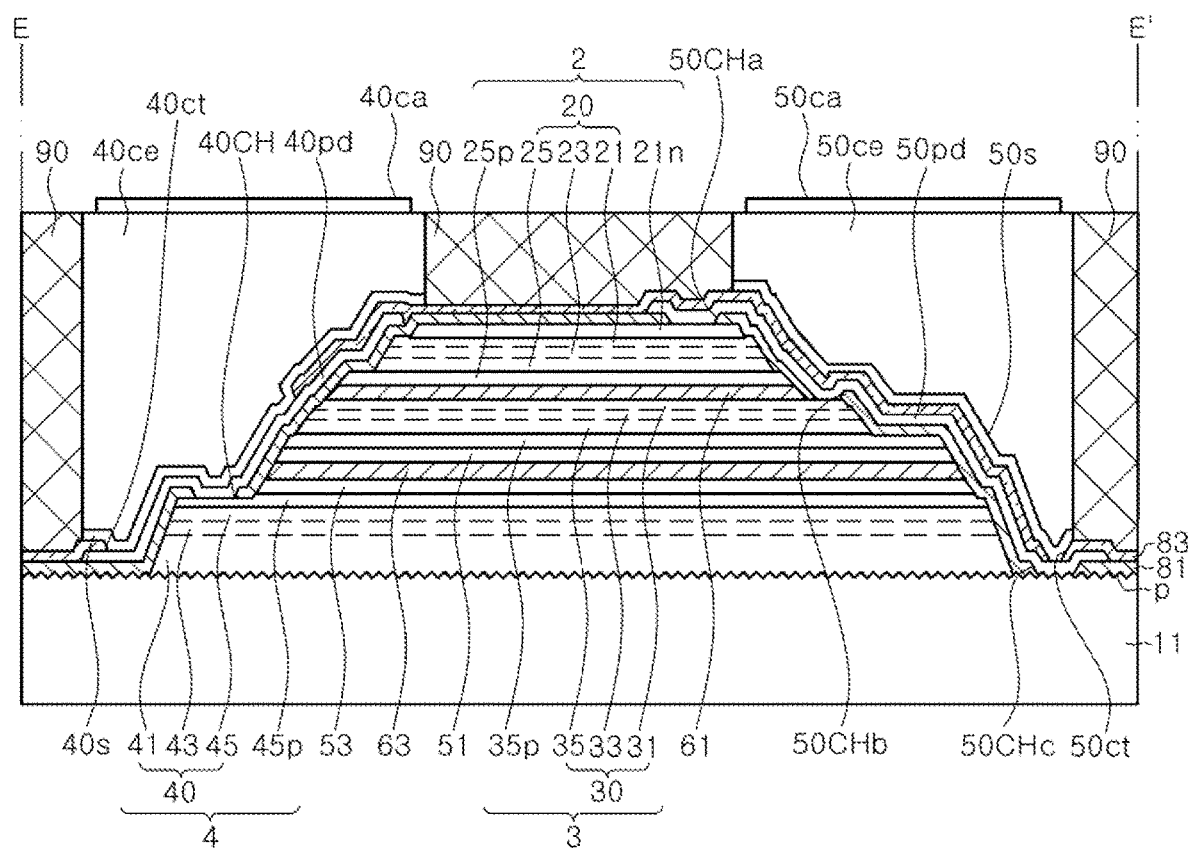
FIG. 18D is a schematic cross-sectional view taken along line E-E' of its corresponding plan view shown in FIG. 18B.

Referring to FIG. 17, the light emitting module 110 may be mounted on a target board 11*b* of a final device, such as a display. The target board 11*b* may include target electrodes 11*s* corresponding to respective lower circuit electrodes 11*pc* of the light emitting module 110. In an exemplary embodiment, the display may include multiple pixels and the light emitting devices 100 may be disposed to correspond to respective pixels. More specifically, the LED stacks of the light emitting device 100 may correspond to sub-pixels of each pixel, respectively. Since the light emitting device 100 includes the first, second, and third LED stacks 20, 30, and 40 vertically stacked one above another, it is possible to substantially reduce the number of light emitting devices to be transferred for each sub-pixel, as compared with a conventional light emitting module.

FIG. 18A, FIG. 18B, FIG. 18C, and FIG. 18D are a schematic perspective view, a plan view, and cross-sectional views illustrating a light emitting device 200 according to another exemplary embodiment.

Referring to FIG. 18A, FIG. 18B, FIG. 18C, and FIG. 18D, the light emitting device 200 according to the illustrated exemplary embodiment is substantially similar to the light emitting device 100 described with reference to FIG. 1A, FIG. 1B, FIG. 1C, and FIG. 1D, except that a third sub-unit 4 is not exposed to the outside as with first and second sub-units 2 and 3. More particularly, in the light emitting device 100, the side surface of the first conductivity type semiconductor layer 41 of the third LED stack 40 is exposed to the outside, but in the light emitting device 200 of the illustrated exemplary embodiment, a side surface of a first conductivity type semiconductor layer 41 of a third LED stack 40 is not exposed to the outside.

In the illustrated exemplary embodiment, the third sub-unit 4 has a smaller area than a substrate 11. In particular, the first conductivity type semiconductor layer 41 of the third LED stack 40 may be disposed on a partial region of the substrate 11, and the substrate 11 in the vicinity of the first conductivity type semiconductor layer 41 may be exposed from the third LED stack 40.

The side surface of the first conductivity type semiconductor layer 41 may be covered with a first insulation layer 81 and/or a second insulation layer 83. The first insulation s layer 81 and/or the second insulation layer 83 may include a distributed Bragg reflector as described above, and thus, light directed toward the side surface of the first conductivity type semiconductor layer 41 may be reflected by the distributed Bragg reflector. Accordingly, light emitted from the third sub-unit 4 in a direction horizontal to a rear surface of the substrate 11 may be reduced, and light emitted in a direction vertical to the rear surface of the substrate 11 may be increased, thereby adjusting a radiation pattern.

(Experimental Example)

Various samples were prepared to see changes in radiation patterns of light depending on a ratio of a thickness of the substrate 11 to thicknesses of a protruding pattern P, a distributed Bragg reflector, and first to third sub-units. Sample 1 is a light emitting device is manufactured in a conventional manner, in which the protruding pattern P or the distributed Bragg reflector is not applied, and a thickness ratio of the first to third sub-units to the substrate is about 9:1. Sample 2 is substantially similar to the Sample 1, except that the protruding pattern P is applied, and in Sample 3, a second insulation layer 83 is formed as a distributed Bragg reflector in addition to elements of the Sample 2. Sample 4 is similar to the Sample 3, except that a thickness of the substrate 11 to a thickness of the first to third sub-units is about 7.5:1, Sample 5 is similar to the Sample 3, except that the thickness of the substrate 11 to the thickness of the first to third sub-units to the substrate is 5:1, and Sample 6 is similar to the Sample 3, except that the thickness of the substrate 11 to the thickness of the first to third sub-units is 2.5:1. The thickness of the substrate of the Samples 1 to 3 is 180 μm, and the thickness of the substrate of the Samples 4 to 6 is 150 μm, 100 μm, and 50 μm, respectively. For the Samples 1 to 6, normalized radiation patterns were obtained by measuring radiant luminous intensities of blue light, green light, and red light depending on angles, and standard deviations of the normalized radiant light intensities of blue light, green light, and red light at an angle perpendicular to the substrate 11 (0 degrees), at +45 degrees and −45 degrees with respect to the surface of the substrate 11 were obtained.

Figure 19A:
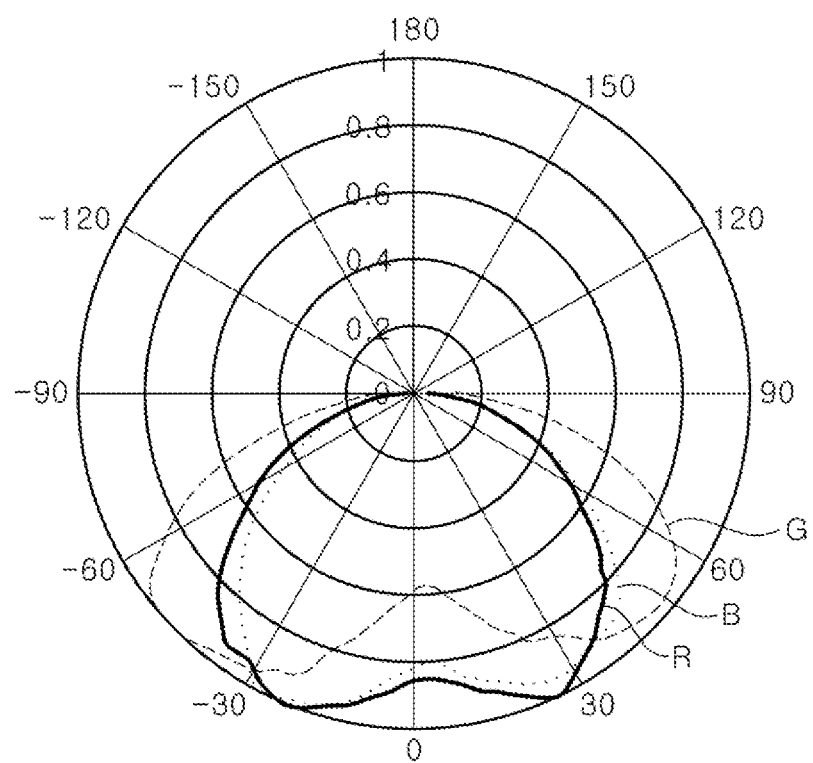
FIG. 19A and FIG. 19B are graphs illustrating normalized radiation patterns depending on angles of a light emitting device according to Comparative Example 1.
Figure 19B:
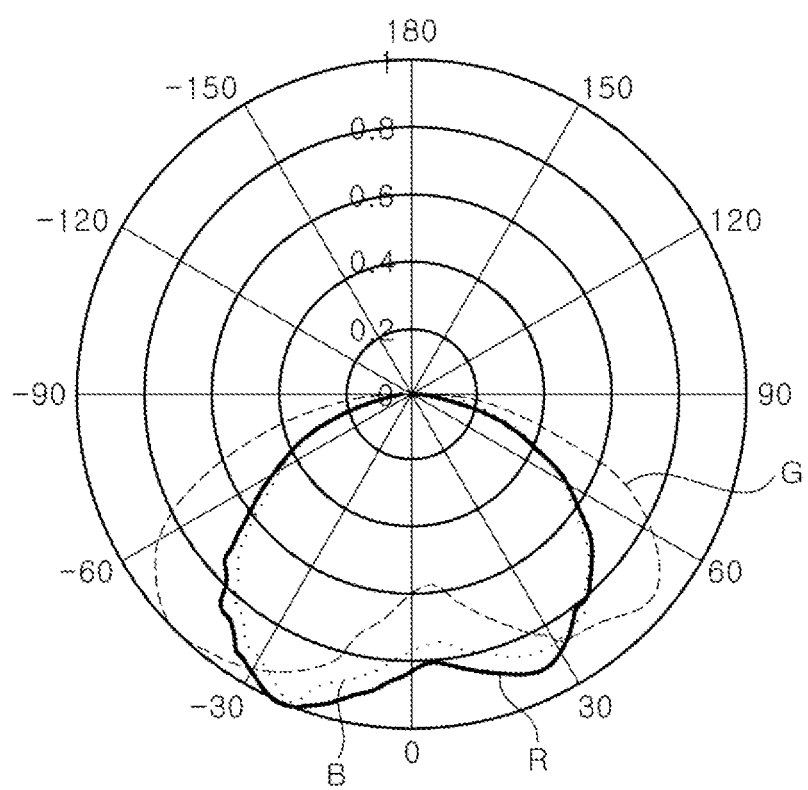

FIG. 19A and FIG. 19B are graphs illustrating normalized radiation patterns depending on angles of a light emitting device according to the Sample 1 (Comparative Example 1). FIG. 19A shows radiation patterns in the X direction of the light emitting device, and FIG. 19B shows radiation patterns in the Y direction of the light emitting device.

Referring to FIG. 19A and FIG. 19B, radiation patterns of red light R emitted from the first sub-unit 2 and blue light B emitted from the second sub-unit 3 are substantially identical to each other, but it can be seen that a radiation pattern of green light G emitted from is the third sub-unit 4 shows a significant difference from those of blue light B and red light R. In particular, the radiation pattern of green light G shows a relatively low luminous intensity at 0 degrees and a wider distribution in a lateral direction.

Figure 20A:
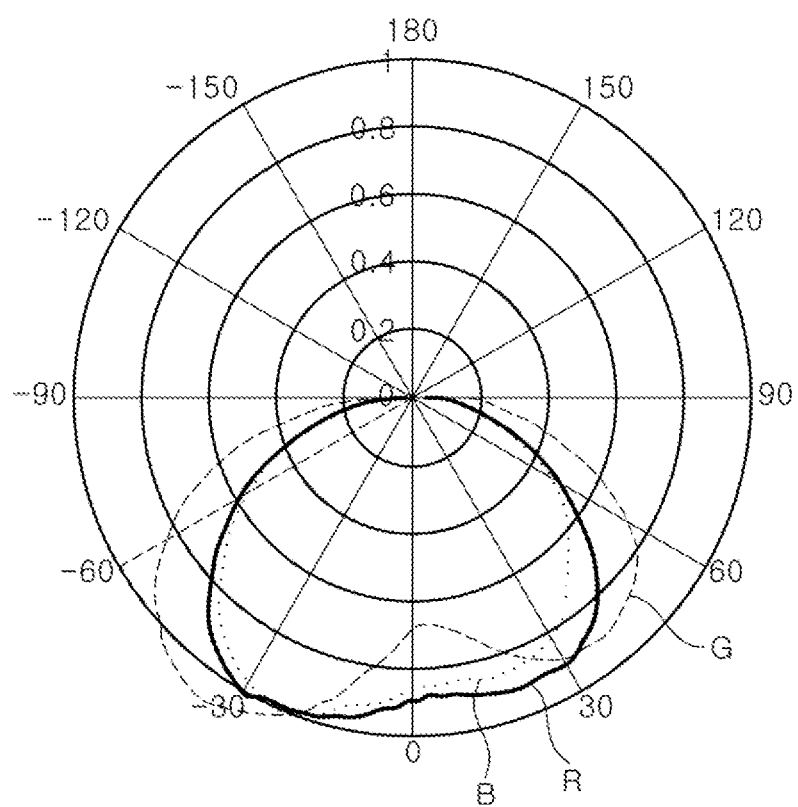
FIG. 20A and FIG. 20B are graphs illustrating normalized radiation patterns depending on angles of a light emitting device according to Comparative Example 2.
Figure 20B:
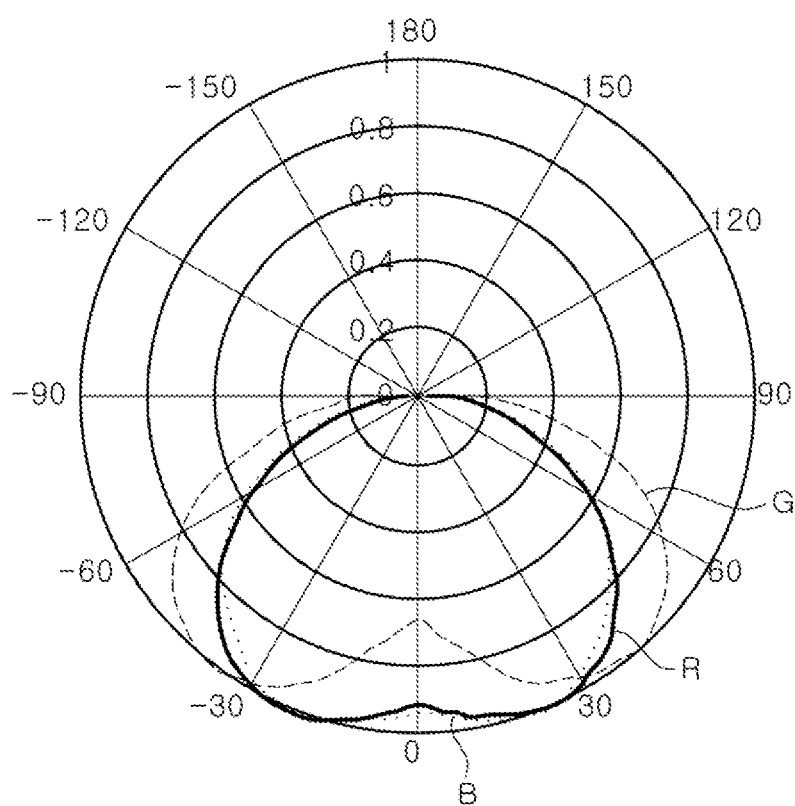

FIG. 20A and FIG. 20B are graphs illustrating normalized radiation patterns depending on angles of a light emitting device according to the Sample 2 (Comparative Example 2). FIG. 20A shows radiation patterns in the X direction of the light emitting device, and FIG. 20B shows radiation patterns in the Y direction of the light emitting device.

Referring to FIG. 20A and FIG. 20B, radiation patterns of red light R emitted from the first sub-unit 2 and blue light B emitted from the second sub-unit 3 are substantially identical to each other, but it can be seen that a radiation pattern of green light G emitted from the third sub-unit 4 shows a significant difference from those of blue light B and red light R. In particular, the radiation pattern of green light G shows a relatively low luminous intensity at 0 degrees and a wider distribution in a lateral direction. However, as compared to the Comparative Example 1, a width of the radiation pattern of green light G was narrowed in both the X and Y directions, and the luminous intensity at 0 degrees was increased. As such, it can be seen that by employing the protruding pattern P, the radiation pattern of light emitted from the third sub-unit 4 may be adjusted.

Figure 21A:
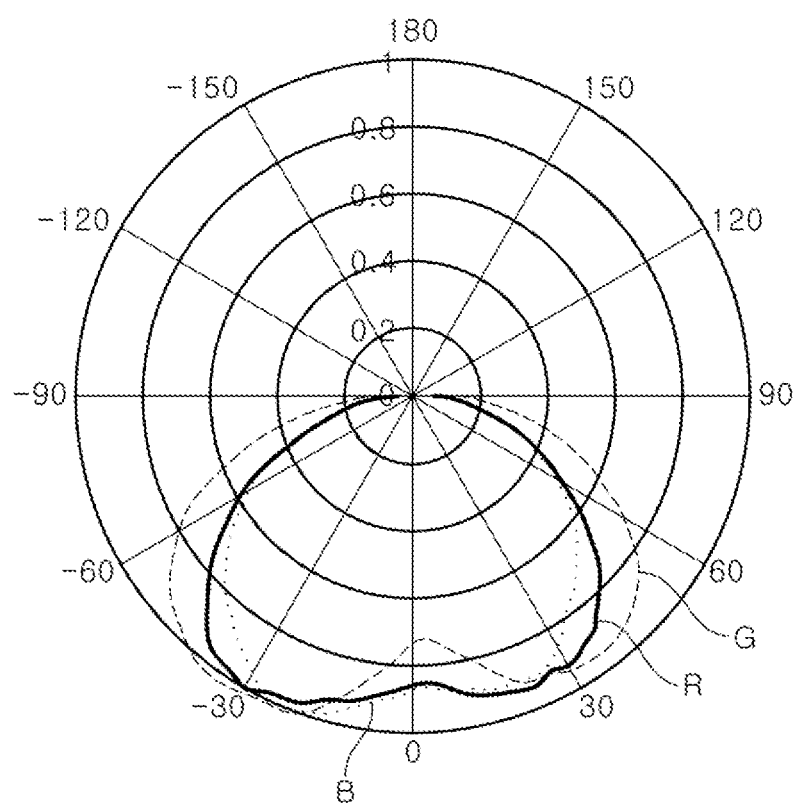
FIG. 21A and FIG. 21B are graphs illustrating normalized radiation patterns depending on angles of a light emitting device according to an exemplary embodiment.
Figure 21B:
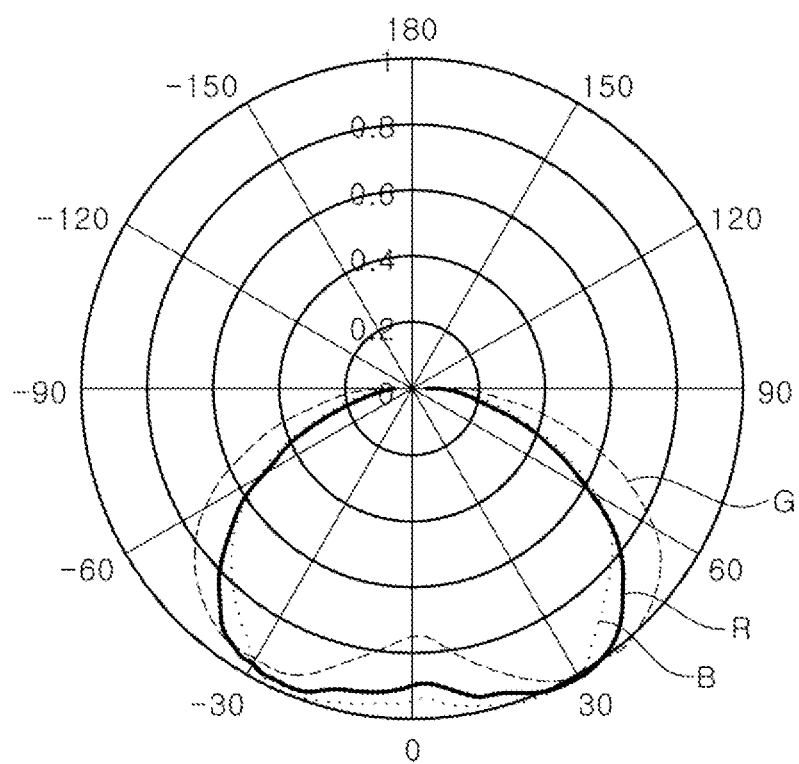

FIG. 21A and FIG. 21B are graphs illustrating normalized radiation patterns depending on angles of a light emitting device according to the Sample 3 according to an exemplary embodiment. FIG. 21A shows radiation patterns in the X direction of the light emitting device, and FIG. 21B shows radiation patterns in the Y direction of the light emitting device.

Referring to FIG. 21A and FIG. 21B, although a radiation pattern of green light G in the light emitting device of the Sample 3 is different from those of blue light B and red light R, it can be seen that a difference between the radiation patterns is significantly mitigated, compared to the Comparative Examples 1 and 2. In particular, the radiation pattern of green light G was narrower in width compared to the Comparative Example 2, and a luminous intensity at 0 degrees was increased. It can be seen that by employing the distributed Bragg reflector in conjunction with the protruding pattern P, the difference in the radiation patterns of light emitted from the light emitting device can be reduced.

Figure 22A:
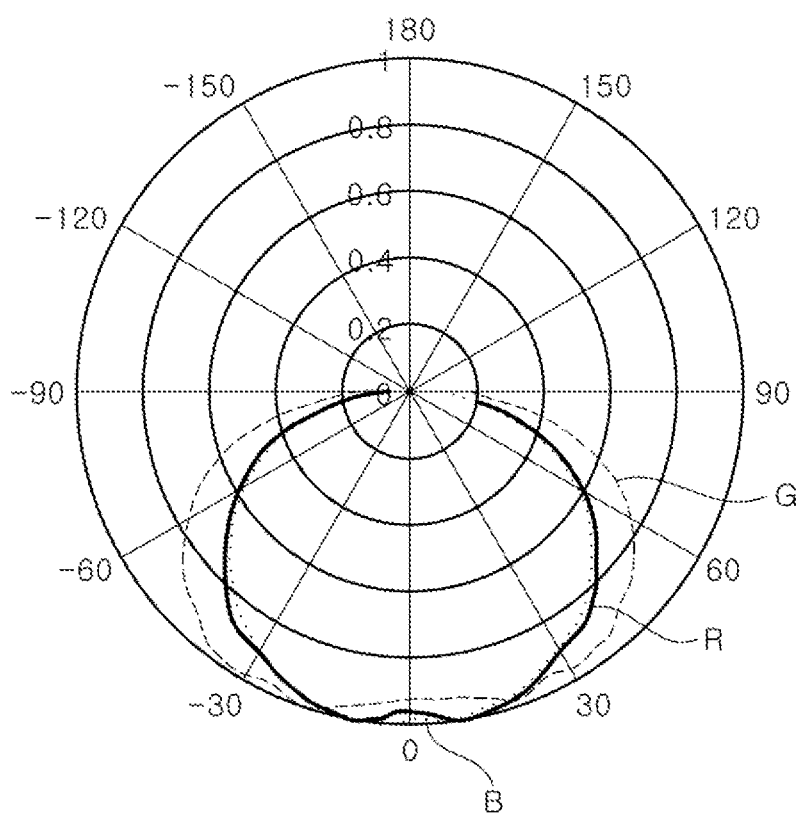
FIG. 22A and FIG. 22B are graphs illustrating normalized radiation patterns zo depending on angles of a light emitting device according to an exemplary embodiment.
Figure 22B:
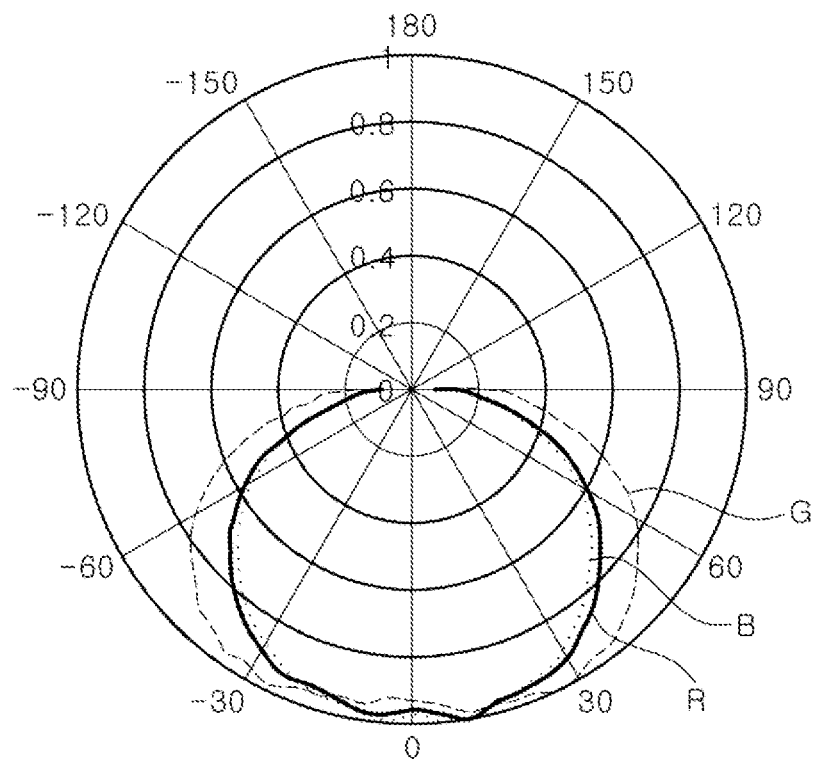

FIG. 22A and FIG. 22B are graphs illustrating normalized radiation patterns depending on angles of a light emitting device of the Sample 6 according to an exemplary embodiment. FIG. 22A shows radiation patterns in the X direction of the light emitting device, and FIG. 22B shows radiation patterns in the Y direction of the light emitting device.

Referring to FIG. 22A and FIG. 22B, in the light emitting device according to an exemplary embodiment, a radiation pattern of green light G is similar to those of blue light B and red light R, and it can be seen that a difference between the radiation patterns is further mitigated, compared to the Sample 3. The radiation patterns of red light R, blue light B, and green light G were all close to the Lambertian shape. In particular, a luminous intensity of light emitted from the third LED stack 40 at 0 degrees was increased sharply, so that the Lambertian shape thereof was improved compared to that of the Sample 3. By reducing the ratio of the thickness of the substrate 11 to the overall thickness of the first to third sub-units 2, 3, and 4, the difference in the radiation patterns of light emitted from the light emitting device could be reduced.

Figure 23A:
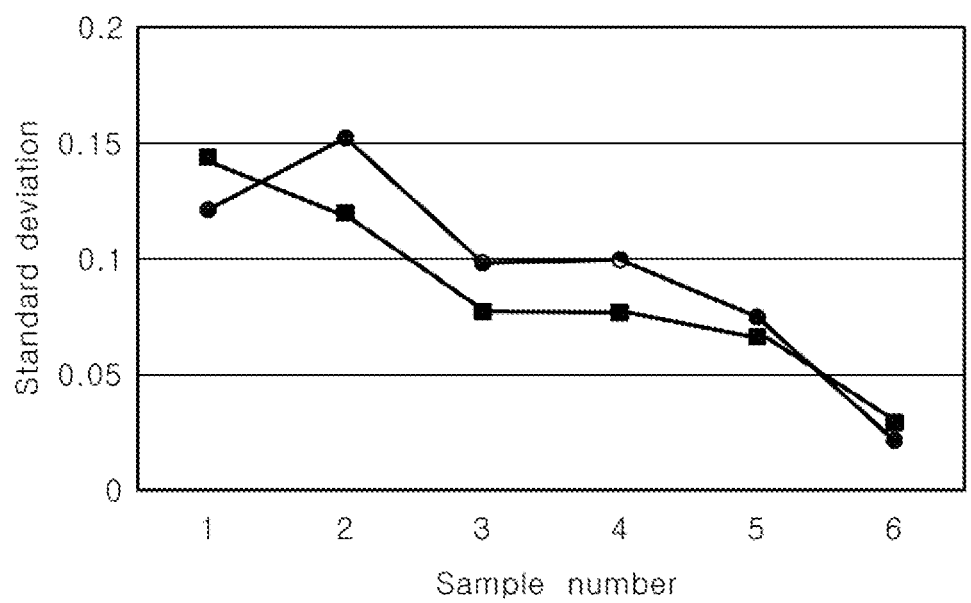
FIG. 23A, FIG. 23B, and FIG. 23C are graphs showing standard deviations of normalized values of blue light, green light, and red light at viewing angles of 0 degrees, +45 degrees, and −45 degrees for six samples including Comparative Examples 1 and 2 and exemplary embodiments, respectively.
Figure 23B:
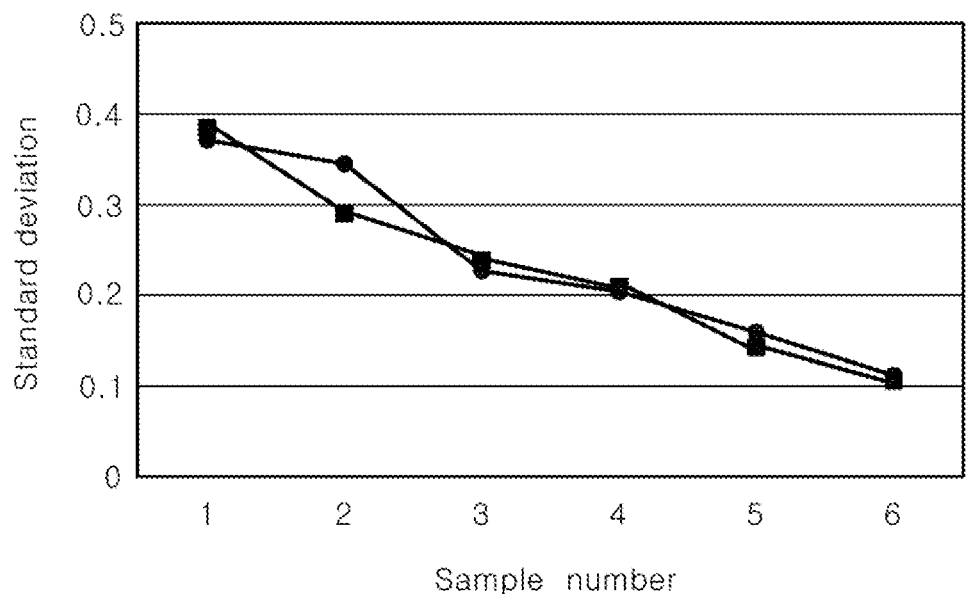
Figure 23C:
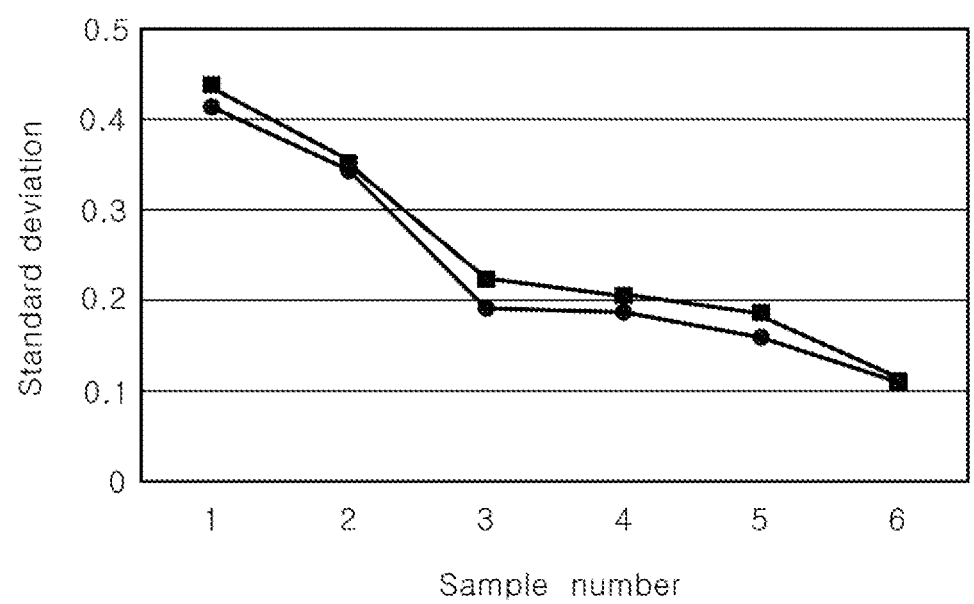

FIG. 23A, FIG. 23B, and FIG. 23C are graphs showing standard deviations of normalized values of blue light, green light, and red light at viewing angles of 0 degrees, +45 degrees, and −45 degrees for the six samples including the Comparative Examples 1 and 2 and the Samples 3 and 6, respectively. The standard deviations were obtained by normalizing measured radiant luminous intensities for each color of light, and using the normalized values of the three colors of light at set angles. In the graphs, dots indicated by squares represent standard deviations of normalized values of radiant luminous intensities measured in the X direction, and dots indicated by circles represent standard deviations of normalized values of radiant luminous intensities measured in the Y direction.

Referring to FIG. 23A, at a viewing angle of 0 degrees, the Samples 1 and 2 exhibited standard deviations greater than 0.1 in both the X and Y directions, whereas the Samples 3 to 6 exhibited standard deviations less than about 0.1. In more detail, in the Samples 3 to 6 according to exemplary embodiments, color deviations of blue light, green light, and red light at the viewing angle of 0 degree are relatively small. In particular, the Sample having the smallest ratio of the thickness of the substrate to the first to third sub-units had the smallest color deviations of blue light, green light, and red light at the viewing angle of 0 degrees.

Referring to FIG. 22B and FIG. 22C, at viewing angles of +45 degrees and −45 degrees, the Samples 1 and 2 exhibited standard deviations greater than 0.25 in both the X and Y directions, whereas the Samples 3 to 6 exhibited standard deviations less than about 0.25. In more detail, in the Samples 3 to 6 according to exemplary embodiments, color deviations of blue light, green light, and red light are relatively small at the viewing angles of +45 degrees and −45 degrees. In particular, the Sample 6 having the smallest ratio of the thickness of the substrate to the first to third sub-units had the smallest color deviations of blue light, green light, and red light at the viewing angles of +45 degrees and −45 degrees.

The standard deviations of each sample at the viewing angles of 0 degrees, +45 degrees, and −45 degrees are summarized in Table 1 below.

TABLE 1

| Sample No. | 0 degree | | +45 degree | | −45 degree | |
|---|---|---|---|---|---|---|
| | X | Y | X | Y | X | Y |
| 1 | 0.145 | 0.122 | 0.383 | 0.370 | 0.431 | 0.410 |
| 2 | 0.120 | 0.153 | 0.290 | 0.345 | 0.342 | 0.333 |
| 3 | 0.078 | 0.199 | 0.238 | 0.226 | 0.221 | 0.193 |
| 4 | 0.077 | 0.100 | 0.210 | 0.204 | 0.205 | 0.189 |
| 5 | 0.067 | 0.076 | 0.143 | 0.159 | 0.187 | 0.158 |
| 6 | 0.029 | 0.021 | 0.106 | 0.112 | 0.112 | 0.109 |

Figure 24:
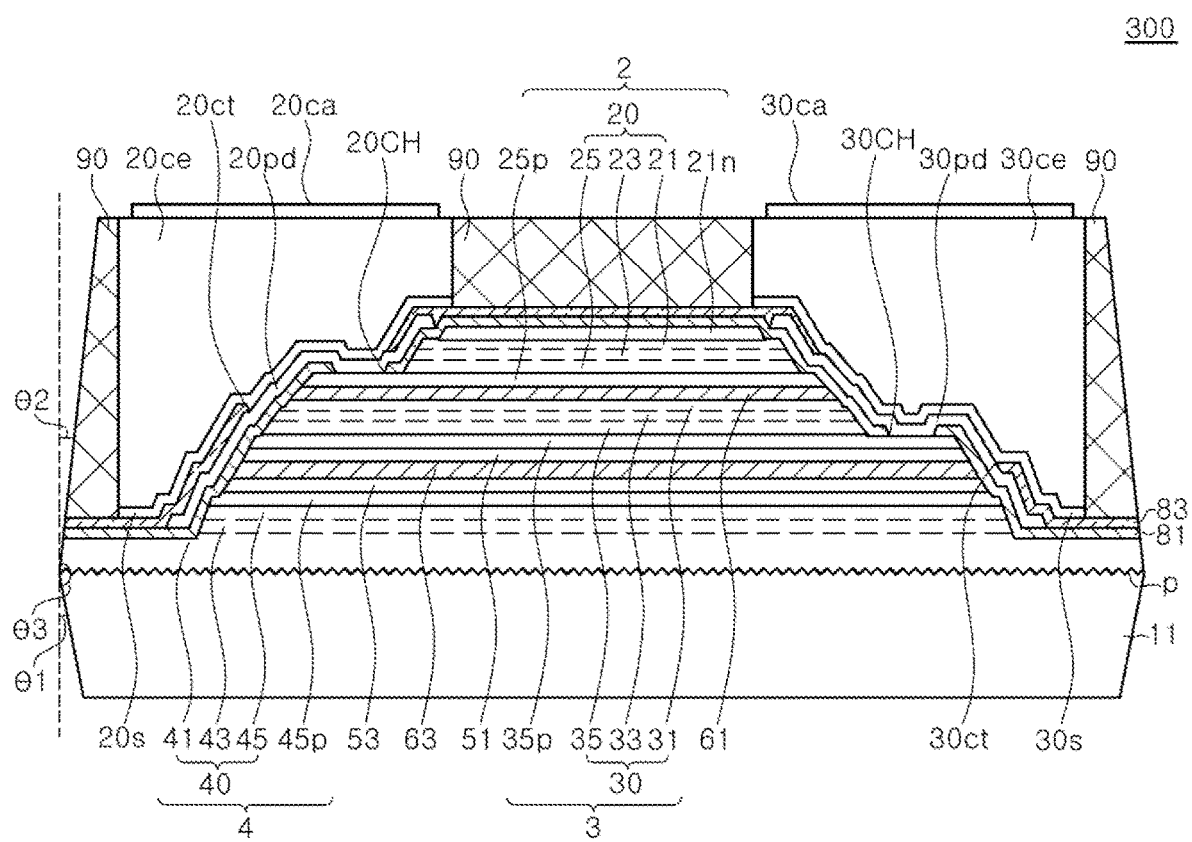
FIG. 24 is a schematic cross-sectional view of a light emitting device according to another exemplary embodiment.

FIG. 24 is a schematic sectional view illustrating a light emitting device 300 according to another exemplary embodiment.

Referring to FIG. 24, the light emitting device 300 according to the illustrated exemplary embodiment is substantially similar to the light emitting device 100 described with reference to FIG. 1A, FIG. 1B, FIG. 1C, and FIG. 1D, except that side surfaces of a substrate 11 and a protection layer 90 are inclined.

The side surface of the substrate 11 may be inclined at a first angle $\theta 1$ with respect to a direction vertical to an upper surface of a first LED stack 20. In particular, the substrate 11 may have a shape in which a width thereof becomes narrower as a distance to the semiconductor layers increases. When the side surface of the substrate 11 is inclined as compared to when its side surface is vertical, a surface area visible from the side surface is increased, and thus, light may be focused in a direction vertical to the substrate 11, thereby reducing a deviation of a viewing angle. Furthermore, since a side region of the substrate 11 is reduced, an overall volume of the substrate 11 is reduced. In particular, a volume of a region of the substrate 11 disposed in a region that does not vertically overlap with active layers 23, 33, and 43 of the light emitting device 300 is reduced, as thus, a volume of a path through which light has to pass is reduced. In this manner, light extraction efficiency may be further increased.

In addition, when a plurality of pixels is arrayed, a separation distance between the light emitting devices 300 may be increased as being closer to a light exiting surface of the substrate 11. In general, adjacent pixels may interfere with and block a side view, which may cause a deviation of viewing angles and also cause a color deviation depending on the viewing angles. According to an exemplary embodiment, since the separation distance between the adjacent substrates 11 increases toward the light emission direction, blocking of the view may be alleviated and thereby reduces color deviation.

A side surface of the protection layer 90 may be inclined at a second angle $\theta 2$ with respect to the direction vertical to the upper surface of the first LED stack 20. The protection layer 90 may have a shape in which a width is narrowed in a direction away from the substrate 11. When the plurality of pixels is arrayed, a distance between outer surfaces of the protection layers 90 between adjacent pixels becomes closer toward the light emitting surface of the substrate 11. By forming the outer surface of the protection layer 90 inclined, when a molding layer including a light absorbing material is filled between the plurality of pixels, that is, the light emitting devices 300, a greater amount of light absorbing material may be filled between the light emitting devices 300, and thus, color mixing depending on the viewing angles may be further prevented to reduce the color deviation depending on the viewing angles. A side is surface of a first conductivity type semiconductor layer 41 of a third LED stack 40 may also have an inclined shape.

The inclined first angle θ1 of the side surface of the substrate 11 may be equal to or greater than the second inclined angle θ2 of the protection layer 90, and a third angle θ3 between the inclined surface of the side surface of the substrate 11 and the inclined surface of the protection layer 90 may be an obtuse angle greater than 90° and less than 180°. Through this angular shape, it is possible to reduce the color deviation depending on the viewing angles while maintaining the light extraction efficiency.

Although some embodiments have been described herein, it should be understood that these embodiments are provided for illustration only and are not to be construed in any way as limiting the present disclosure. In addition, it should be understood that features or components described with respect to an exemplary embodiment may be applied to other embodiments without departing from the spirit of the present disclosure.

What is claimed is:

1. A light emitting device comprising:
   a substrate having a protruding pattern on an upper surface thereof;
   a first sub-unit disposed on the substrate;
   a second sub-unit disposed between the substrate and the first sub-unit;
   a third sub-unit disposed between the substrate and the second sub-unit;
   a first insulation layer at least partially in contact with side surfaces of the first sub-unit, the second sub-unit, or the third sub-unit; and
   a second insulation layer at least partially overlapping with the first insulation layer,
   wherein at least one of the first insulation layer or the second insulation layer includes a distributed Bragg reflector,
   wherein a first region of a side wall of at least one of the first sub-unit, the second sub-unit, or the third sub-unit is inclined at a first non-zero angle, and a second region of the side wall of the at least one of the first sub-unit, the second sub-unit, or the third sub-unit is inclined at a second non-zero angle that is different from the first non-zero angle, and
   wherein a first side region of the substrate is inclined at a third non-zero angle.

2. The light emitting device of claim 1, wherein:
   the substrate comprises a sapphire substrate; and
   the protruding pattern comprises a same material as the substrate.

3. The light emitting device of claim 2, wherein:
   the protruding pattern includes protrusions; and
   a diameter of each of the protrusions is about 2 μm or less, and an interval between the protrusions is about 1 μm or less.

4. The light emitting device of claim 3, wherein the protrusions have conical shapes.

5. The light emitting device of claim 1, wherein:
   the first sub-unit includes a first LED stack;
   the second sub-unit includes a second LED stack;
   the third sub-unit includes a third LED stack; and
   the first to third LED stacks are configured to emit light of different wavelengths.

6. The light emitting device of claim 5, wherein the first LED stack, the second LED stack, and the third LED stack are configured to emit red light, blue light, and green light, respectively.

7. The light emitting device of claim 5, further comprising:
   a first connection electrode electrically connected to the first LED stack;
   a second connection electrode electrically connected to the second LED stack;
   a third connection electrode electrically connected to the third LED stack; and
   a fourth connection electrode electrically connected to each of the first, second, and third LED stacks.

8. The light emitting device of claim 7, wherein at least one of the first connection electrode, the second connection electrode, the third connection electrode, or the fourth connection electrode overlaps with a side surface of each of the first LED stack, the second LED stack, and the third LED stack.

9. The light emitting device of claim 7, further comprising a protection layer covering at least a portion of each of the first connection electrode, the second connection electrode, the third connection electrode, or the fourth connection electrode while exposing a side surface of the substrate.

10. The light emitting device of claim 1, further comprising:
    a first adhesive layer disposed between the first sub-unit and the second sub-unit; and
    a second adhesive layer disposed between the second sub-unit and the third sub-unit.

11. The light emitting device of claim 10, wherein a thickness of the substrate to an overall thickness of the first sub-unit, the second sub-unit, and the third sub-unit is in a range of 1.5:1 to 4:1.

12. The light emitting device of claim 1, wherein:
    the first insulation layer includes $SiO_2$; and
    the second insulation layer includes the distributed Bragg reflector including $SiO_2$ and TiO2 alternately disposed with each other.

13. The light emitting device of claim 5, wherein the distributed Bragg reflector is configured to reflect about 95% or more of light emitted from the first LED stack, the second LED stack, and the third LED stack.

14. The light emitting device of claim 9, wherein a thickness of the substrate is less than that of a partial region of the protection layer surrounding a outermost side surfaces of the first to fourth connection electrodes.

15. The light emitting device of claim 9, wherein a thickness of the substrate is greater than that of a partial region of the protection layer disposed in a region vertically overlapping with the first sub-unit.

16. A light emitting module, comprising:
    a circuit board;
    a light emitting device disposed on the circuit board; and
    a protection layer covering the light emitting device,
    wherein the light emitting device comprises:
      a substrate having a protruding pattern on an upper surface thereof;
      a first sub-unit disposed on the substrate;
      a second sub-unit disposed between the substrate and the first sub-unit;
      a third sub-unit disposed between the substrate and the second sub-unit;
      a first insulation layer partially in contact with side surfaces of the first sub-unit, the second sub-unit, or the third sub-unit; and
      a second insulation layer at least partially overlapping with the first insulation layer, and
    wherein at least one of the first insulation layer or the second insulation layer includes a distributed Bragg reflector, wherein a first region of the protection layer is disposed on a side region of at least one of the first sub-unit, the second sub-unit, or the third sub-unit and is inclined at a first non-zero angle, and a second region of the protection layer is disposed on the side region of the at least one of the first sub-unit, the second sub-unit, or the third sub-unit and is inclined at a second non-zero angle that is different from the first non-zero angle, and wherein a first side region of the substrate is inclined at a third non-zero angle.

17. The light emitting module of claim 16, wherein:
the substrate comprises a sapphire substrate; and
the protruding pattern comprises a same material as the substrate.

18. The light emitting module of claim 16, wherein:
the first sub-unit includes a first LED stack;
the second sub-unit includes a second LED stack;
the third sub-unit includes a third LED stack; and
a thickness of the substrate to an overall thickness of the first sub-unit, the second sub-unit, and the third sub-unit is in a range of 1.5:1 to 4:1.

19. The light emitting module of claim 16, wherein:
the first insulation layer includes $SiO_2$; and
the second insulation layer includes the distributed Bragg reflector.

20. The light emitting module of claim 19, wherein the distributed Bragg reflector includes $SiO_2$ and $TiO_2$ disposed alternately with each other.

21. The light emitting device of claim 1, wherein the first region of the side wall of the substrate is inclined in a direction that is opposite to a direction in which the first region of the side wall of the at least one of the first sub-unit, the second sub-unit, or the third sub-unit is inclined.

* * * * *